(12) United States Patent
Cho et al.

(10) Patent No.: US 10,902,905 B2
(45) Date of Patent: Jan. 26, 2021

(54) MEMORY DEVICE

(71) Applicant: Samsung Electronics Co., Ltd., Suwon-si (KR)

(72) Inventors: Yong Sung Cho, Hwaseong-si (KR); Venkataramana Gangasani, Suwon-si (KR); Hee Won Kim, Anyang-si (KR); Tae Hui Na, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 18 days.

(21) Appl. No.: 16/578,383

(22) Filed: Sep. 22, 2019

(65) Prior Publication Data

US 2020/0321046 A1 Oct. 8, 2020

(30) Foreign Application Priority Data

Apr. 5, 2019 (KR) .................. 10-2019-0040369

(51) Int. Cl.
| | |
|---|---|
| *G11C 11/408* | (2006.01) |
| *G11C 11/409* | (2006.01) |
| *G11C 29/00* | (2006.01) |
| *G11C 7/04* | (2006.01) |
| *G11C 11/4074* | (2006.01) |

(52) U.S. Cl.
CPC ............ *G11C 11/4087* (2013.01); *G11C 7/04* (2013.01); *G11C 11/409* (2013.01); *G11C 11/4074* (2013.01); *G11C 29/842* (2013.01)

(58) Field of Classification Search
CPC . G11C 11/4087; G11C 11/409; G11C 29/842; G11C 7/04; G11C 11/4074; G11C 13/0026; G11C 13/0028; G11C 2213/73; G11C 13/0033; G11C 13/0023; G11C 2213/71; G11C 2213/76; G11C 13/003; G11C 13/0061; G11C 29/028; G11C 29/50; G11C 13/0004; G11C 13/004; G11C 7/02; G11C 5/025
See application file for complete search history.

(56) References Cited

U.S. PATENT DOCUMENTS

| | | | |
|---|---|---|---|
| 7,009,905 B2* | 3/2006 | Aipperspach ............ | G11C 7/04 365/190 |
| 7,092,277 B2* | 8/2006 | Bedeschi ................. | G11C 7/12 365/148 |
| 7,283,387 B2 | 10/2007 | Cho et al. | |
| 7,701,758 B2 | 4/2010 | Nakai | |
| 8,228,720 B2 | 7/2012 | Choi et al. | |
| 8,422,282 B2 | 4/2013 | Park | |

(Continued)

*Primary Examiner* — Gene N Auduong
(74) *Attorney, Agent, or Firm* — Muir Patent Law, PLLC

(57) ABSTRACT

A memory device includes a plurality of memory cells connected to a plurality of word lines and a plurality of bit lines; a decoder circuit including a first bias circuit inputting a first bias voltage to a selected word line, and a second bias circuit inputting a second bias voltage to a selected bit line, a first switch element connected to the selected word line, and a second switch element connected between the first switch element and the first bias circuit; and a control logic configured to control the first and second switch elements, when a predetermined delay time elapses after the second bias voltage is input to the selected bit line. The control logic turns off the first switch element while the second switch element is turned on.

20 Claims, 23 Drawing Sheets

(56) References Cited

U.S. PATENT DOCUMENTS

| | | |
|---|---|---|
| 9,117,495 B2 | 8/2015 | Siau et al. |
| 9,165,647 B1 | 10/2015 | Guliani et al. |
| 9,530,494 B2 | 12/2016 | Lee et al. |
| 10,566,052 B2 * | 2/2020 | Mirichigni .......... G11C 11/5642 |
| 2007/0091665 A1 | 4/2007 | Oh et al. |

* cited by examiner

FIG. 7

MEMORY DEVICE

CROSS-REFERENCE TO RELATED APPLICATION

This application claims benefit of priority to Korean Patent Application No. 10-2019-0040369 filed on Apr. 5, 2019 in the Korean Intellectual Property Office, the disclosure of which is incorporated herein by reference in its entirety.

BACKGROUND

The present inventive concept relates to a memory device.

A memory device using resistance includes a phase change random access memory (PRAM), a resistive memory (ReRAM), a magnetic RAM (MRAM), and the like. Unlike memory devices that write data in a manner that charges or discharges an electric charge, the memory device using resistance may write or erase data using a resistance change. In general, read disturbances or read failures may occur according to an amount of charge capacitance of a selected word line of the memory device. Thus, it is desired to control the charge capacitance of the selected word line by adjusting an operating time of an internal circuit of the memory device.

SUMMARY

An aspect of the present inventive concept is to provide a memory device capable of controlling floating timing of a word line or on/off timing of a switch element connected to the word line, to solve read disturbances and read failures.

According to an aspect of the present inventive concept, a memory device includes a plurality of memory cells connected to a plurality of word lines and a plurality of bit lines, each of the plurality of memory cells including a selection element and an information storage element, the information storage element connected to the selection element and having a phase change material; a decoder circuit including a first bias circuit supplying a first bias voltage to a selected word line of the plurality of word lines, a second bias circuit supplying a second bias voltage to a selected bit line of the plurality of bit lines, a first switch element connected to the selected word line, and a second switch element connected between the first switch element and the first bias circuit; and a control logic configured to control the first and second switch elements. When a predetermined delay time elapses after the second bias voltage is supplied to the selected bit line, the control logic turns off the first and second switch elements, turns off the first switch element while the second switch element is turned on, or turns off the second switch element while the first switch element is turned on.

According to an aspect of the present inventive concept, a memory device includes a memory cell connected to a word line and a bit line; a first decoder circuit including a first bias circuit supplying a first bias voltage to the word line during a first period of time; a second decoder circuit including a second bias circuit supplying a second bias voltage to the bit line during a second period of time after the first period of time; and a control logic configured to electrically separate the first bias circuit from the word line, when a predetermined delay time elapses from a start time of the second period of time. The second bias voltage may have a constant positive voltage.

According to an aspect of the present inventive concept, a method for operating a memory device includes supplying a first bias voltage output from a first bias circuit to a selected word line connected to a selected memory cell to read data, turning on a first switch element connected to the selected word line, turning on a second switch element connected between the first switch element and the first bias circuit, supplying a second bias voltage to a selected bit line connected to the selected memory cell, and turning off the first switch element, when the second switch element is turned on and a predetermined delay time elapses after the second bias voltage is input, or turning off the second switch element, when the first switch element is turned on and a predetermined delay time elapses after the second bias voltage is input.

BRIEF DESCRIPTION OF DRAWINGS

The above and other aspects, features, and advantages of the present disclosure will be more clearly understood from the following detailed description, taken in conjunction with the accompanying drawings, in which:

FIG. 7 is a circuit diagram illustrating an operation of a memory device according to an embodiment of the present inventive concept.

DETAILED DESCRIPTION

Hereinafter, preferred embodiments of the present inventive concept will be described with reference to the accompanying drawings.

Figure 1:
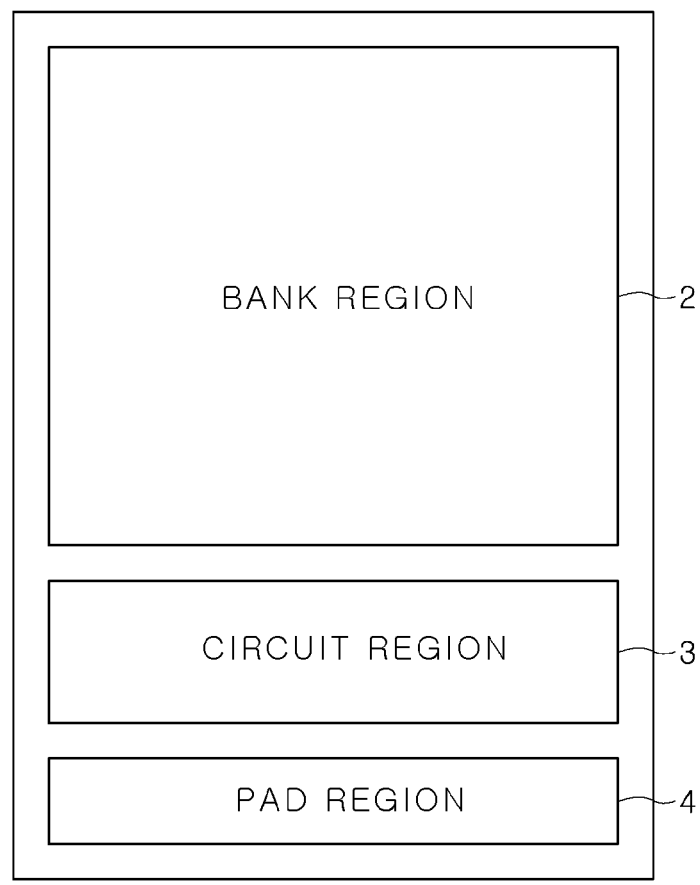
FIGS. 1 to 3 are views schematically illustrating a memory device according to an embodiment of the present inventive concept.
Figure 2:
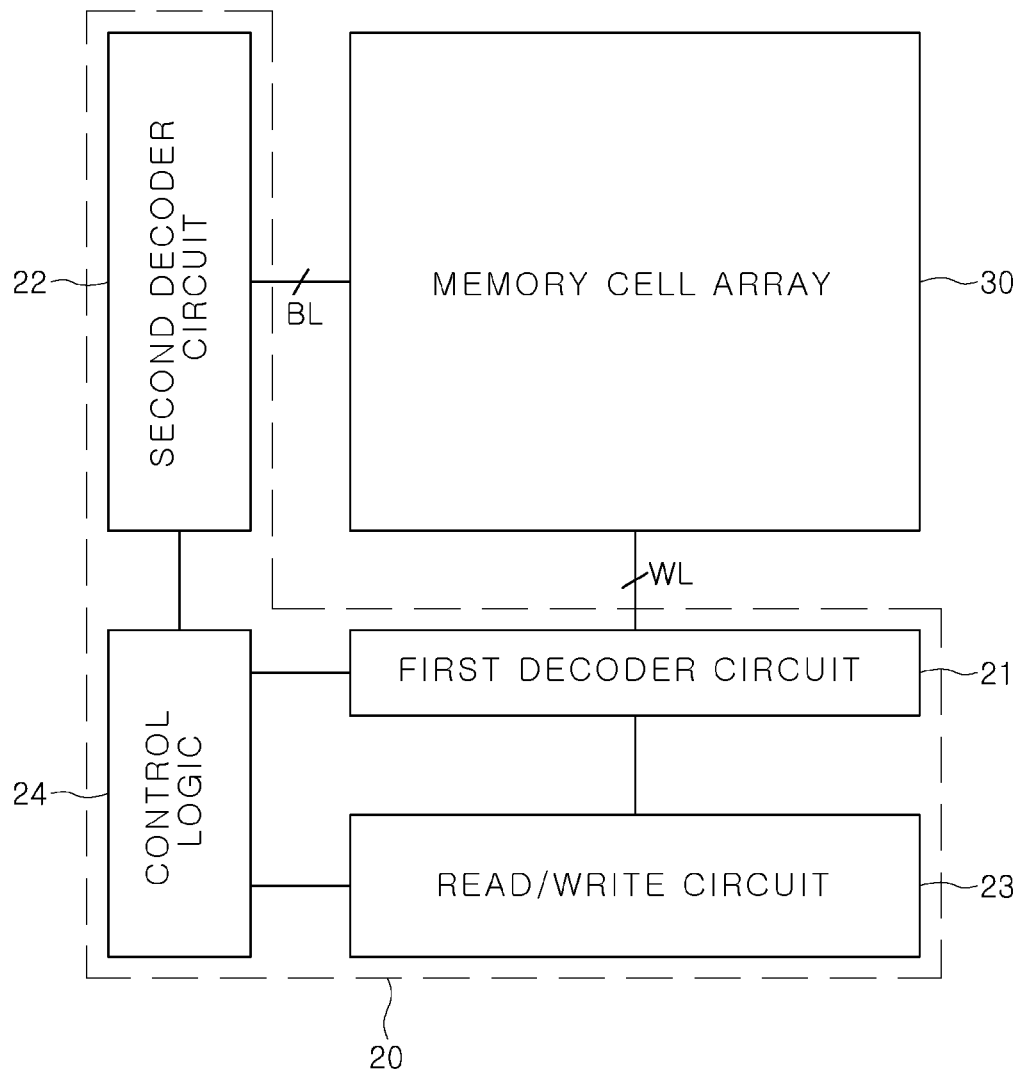
Figure 3:
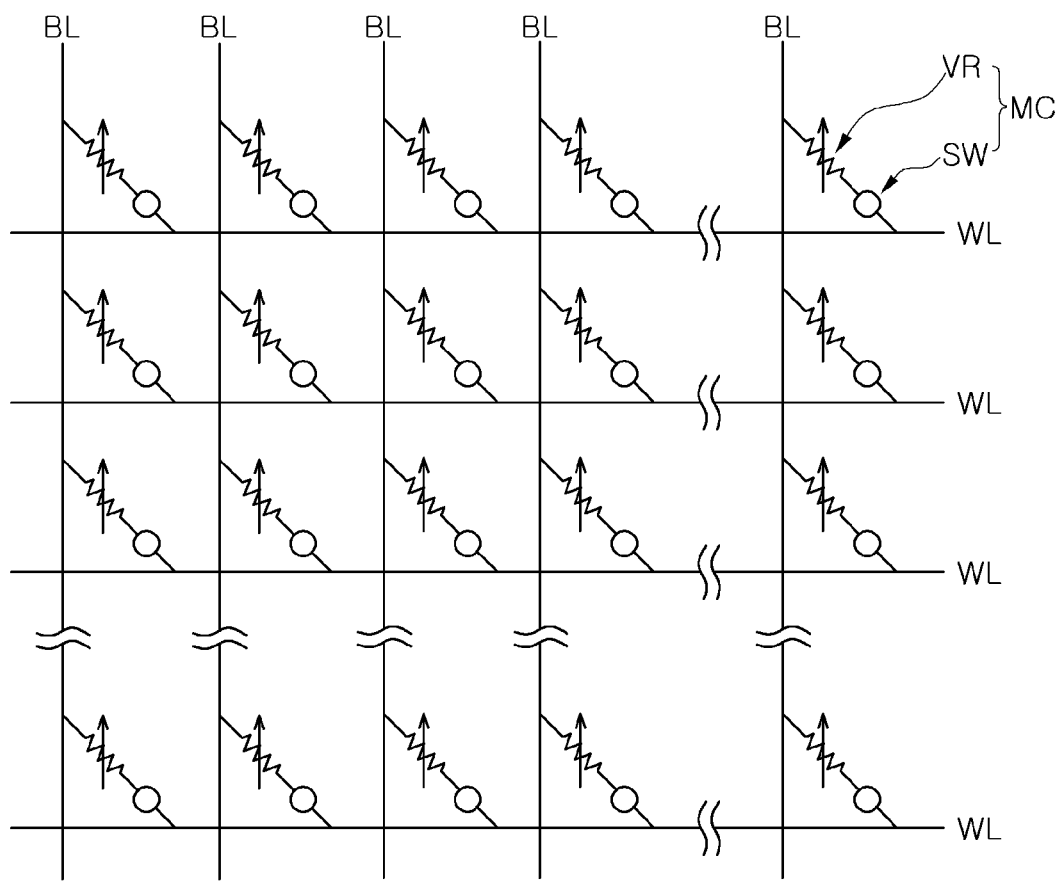

FIGS. 1 to 3 are views schematically illustrating a memory device according to an embodiment of the present inventive concept.

Referring first to FIG. 1, a memory device 1 according to an embodiment of the present inventive concept may have a pad region 4, a circuit region 3, and a bank region 2. The pad region 4 may be a region in which a plurality of pads for inputting and outputting control signals and data are formed, and the circuit region 3 may be a region in which various circuits necessary for operation of the memory device 1 are formed. In the bank region 2, memory cell arrays having memory cells may be formed, and the memory cell arrays may be divided into a plurality of banks.

Although various modifications are present according to example embodiments, each of the plurality of banks formed in the bank region 2 may be divided into a plurality of regions again. At least portion of the plurality of regions dividing each of the plurality of banks may share a decoder circuit, a read/write circuit, and/or the like, included in the circuit region 3, for example.

The circuit region 3 may include a decoder circuit, a read/write circuit, and a control logic for controlling the decoder circuit and the read/write circuit. The decoder circuit may determine at least one of the memory cells formed in the bank region 2 as a selected memory cell, and the read/write circuit may read data of the selected memory cell or write data to the selected memory cell.

Referring next to FIG. 2, a memory device 10 according to an embodiment of the present inventive concept may include a memory control circuit 20 and a memory cell array 30. The memory control circuit 20 may include decoder circuits 21 and 22, a read/write circuit 23, a control logic 24, and the like. The memory cell array 30 may include a plurality of memory cells. The decoder circuits 21 and 22 may include a first decoder circuit 21 connected to the plurality of memory cells through word lines WL, and a second decoder circuit 22 connected to the plurality of memory cells through bit lines BL. Operations of the first decoder circuit 21, the second decoder circuit 22, and the read/write circuit 23 may be controlled by the control logic 24. In an embodiment, the read/write circuit 23 may include a program circuit writing data to at least one selected memory cell specified by the first decoder circuit 21 and the second decoder circuit 22, and a read-out circuit reading data from the selected memory cell.

FIG. 3 is a view schematically illustrating the memory cell array 30. Referring to FIG. 3, the memory cell array 30 according to an embodiment of the present inventive concept may include a plurality of memory cells MC. Each of the plurality of memory cells MC may be provided at an intersection of a plurality of bit lines BL and a plurality of word lines WL. For example, each of the plurality of memory cells MC may be connected to one of the bit lines BL and one of the word lines WL.

For example, each of the plurality of memory cells MC may include a selection element SW and an information storage element VR. In an embodiment, the selection element SW may include at least one of a PN junction diode, a Schottky diode, and an ovonic threshold switch (OTS). In an embodiment, the information storage element VR may be formed of a phase change material including a chalcogenide material, a super-lattice, and the like. For example, the information storage element VR may include a phase change material capable of occurring phase transitions between an amorphous phase and a crystalline phase, depending on a heating time and a temperature. The information storage element VR and the selection element SW may be connected to each other in series.

The memory control circuit 20 may perform a phase-transition of the phase change material of the information storage element VR included in each of the plurality of memory cells MC to an amorphous or crystalline phase through the bit lines BL and the word lines WL, to record or erase data. In an embodiment, the memory control circuit 20 may perform a phase-transition of the phase change material of the information storage element VR included in the memory cell MC to an amorphous phase, to increase resistance of the information storage element VR. Meanwhile, the memory control circuit 20 may perform a phase-transition of the phase change material of the information storage element VR included in the memory cell MC to a crystalline phase, to reduce resistance of the information storage element VR. A relationship between the resistance value of the information storage element VR and whether data are recorded may be variously defined according to example embodiments. The memory control circuit 20 may compare a read voltage detected by the plurality of memory cells MC with a predetermined reference voltage, to perform a reading operation of reading data from the plurality of memory cells MC.

Figure 4:
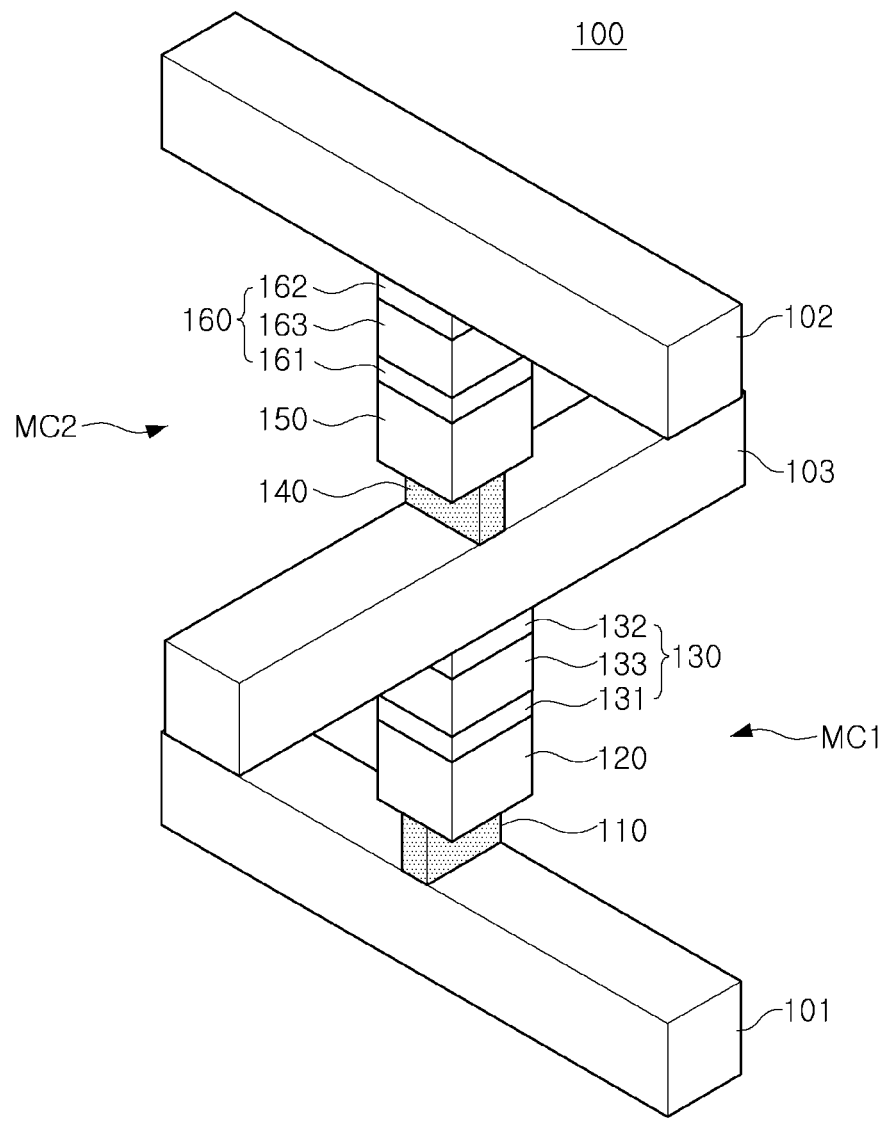
FIG. 4 is a view schematically illustrating a structure of a memory cell included in a memory device according to an embodiment of the present inventive concept.

FIG. 4 is a view schematically illustrating a structure of a memory cell included in a memory device according to an embodiment of the present inventive concept.

Referring to FIG. 4, a memory device 100 according to an embodiment of the present inventive concept includes a first memory cell MC1 and a second memory cell MC2 provided between a plurality of conductive lines 101 to 103. The first memory cell MC1 and the second memory cell MC2 may operate as independent memory cells, respectively. For example, when the first conductive line 101 and the third conductive line 103 are word lines, the second conductive line 102 may be a bit line. In addition, when the first conductive line 101 and the third conductive line 103 are bit lines, the second conductive line 102 may be a word line. Hereinafter, for convenience of explanation, the first conductive line 101 and the third conductive line 103 will be described as a first word line and a second word line, respectively.

The first memory cell MC1 may include a first heating electrode 110, a first information storage element 120, a first selection element 130, and the like. The first selection element 130 may include a first switch electrode 131, a second switch electrode 132, and a first selection layer 133 disposed therebetween. In an embodiment, the first selection layer 133 may include an ovonic threshold switch (OTS) material. When a voltage higher than the threshold voltage of the first memory cell MC1 is applied between the first switch electrode 131 and the second switch electrode 132, an electric current may flow through the first selection layer 133.

The first information storage element 120 may include a phase change material, and, in an embodiment, may include a chalcogenide material. For example, the first information storage element 120 may include Ge—Sb—Te (GST), and a phase change rate according to a crystallization temperature, a melting point, and a crystallization energy of the first information storage element 120, and the like, may be determined, based on a kind of elements included in the first information storage element 120, and a chemical composition ratio thereof.

The second memory cell MC2 may have a structure similar to that of the first memory cell MC1. Referring to FIG. 4, the second memory cell MC2 may include a second heating electrode 140, a second information storage element 150, a second switch element 160, and the like. Structures and characteristics of the second heating electrode 140, the second information storage element 150, and the second selection element 160 may be the same as those of the first heating electrode 110, the first information storage element 120, and the first selection element 130. Hereinafter, a method of writing and erasing data with reference to the first memory cell MC1 will be described.

When a voltage is supplied through the first word line 101 and the bit line 103, joule heat may be generated at an interface between the first heating electrode 110 and the first information storage element 120. The phase change material constituting the first information storage element 120 may be changed from an amorphous phase to a crystalline phase, or from a crystalline phase to an amorphous phase. The first information storage element 120 may have a relatively high resistance in the amorphous phase and a relatively low resistance in the crystalline phase. In an embodiment, data '0' or '1' may be defined depending on a resistance value of the first information storage element 120.

A program voltage may be supplied through the first word line 101 and the bit line 103 to write data to the first memory cell MC1. The program voltage may be higher than a threshold voltage of the ovonic threshold switch material included in the first selection element 130, and thus an electric current may flow through the first selection element 130. The phase change material included in the first information storage element 120 may be changed from an amorphous phase to a crystalline phase by the program voltage, such that data may be written to a first memory region. In an embodiment, when the phase change material included in the first information storage element 120 has a crystalline phase, a state of the first memory cell MC1 may be defined as a set state.

The phase change material included in the first information storage element 120 may be returned from the crystalline phase to the amorphous phase, to erase data recorded in the first memory cell MC1. For example, a predetermined erase voltage may be supplied through the first word line 101 and the bit line 103. Due to the erase voltage, the phase change material included in the first information storage element 120 may change from a crystalline state to an amorphous state. When the phase change material included in the first information storage element 120 has an amorphous phase, a state of the first memory cell MC1 may be defined as a reset state. For example, a maximum value of the erase voltage may be higher than a maximum value of the program voltage, and time duration of supplying the erase voltage may be shorter than time duration of supplying the program voltage.

As described above, resistance values of the information storage elements 120 and 150 may be changed according to states of the phase change materials included in the information storage elements 120 and 150, and a memory control circuit may distinguish data '0' and '1' in the resistance values of the information storage elements 120 and 150. Therefore, as a difference in resistance between the information storage elements 120 and 150, which may be represented by the state of the phase change material included in the information storage elements 120 and 150, becomes larger, the memory control circuit read correctly data stored in the memory cells MC1 and MC2.

Figure 5:
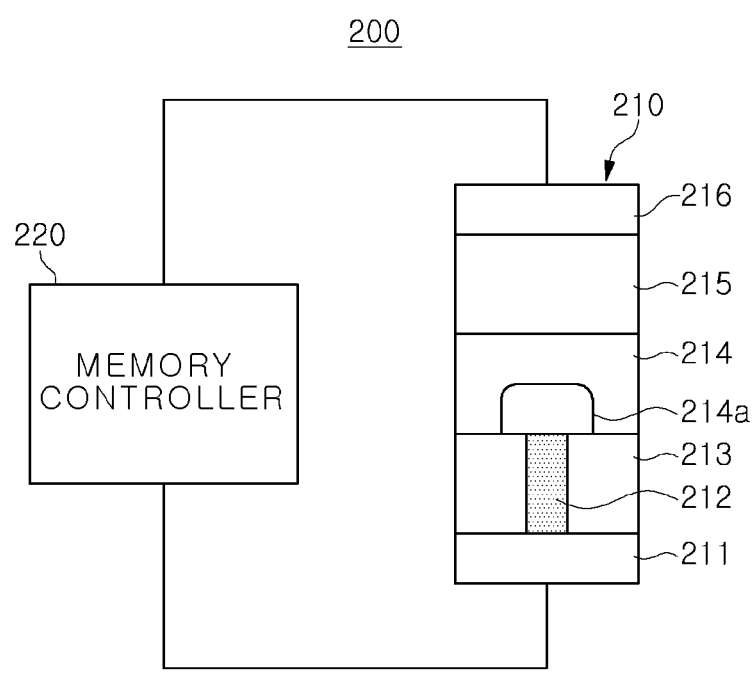
FIG. 5 is a view illustrating an operation of a memory device according to an embodiment of the present inventive concept.

FIG. 5 is a view illustrating an operation of a memory device according to an embodiment of the present inventive concept.

A memory device 200 according to an embodiment of the present inventive concept may be operated by a power source that a memory control circuit 220 supplies to a memory cell 210. Referring to FIG. 5, the memory cell 210 may include a lower electrode 211, a heating electrode 212, an information storage element 214, a selected element 215, an upper electrode 216, and the like. The lower electrode 211 and the upper electrode 216 may receive a voltage output from the memory control circuit 220 through a word line, a bit line, or the like. An insulation layer 213 may be provided around the heating electrode 212, and a region 214a of the information storage element 214 adjacent to the heating electrode 212 may generate a phase change by a power source supplied from the memory control circuit 220.

In an embodiment, a reading operation for discriminating data in the memory cell 210 may be performed by inputting (or supplying) a predetermined bias voltage to the lower electrode 211 and the upper electrode 216, respectively. For example, the memory control circuit 220 may read data of the memory cell 210 by inputting a relatively low first bias voltage to the lower electrode 211 and inputting a relatively high second bias voltage to the upper electrode 216.

For example, the memory control circuit 220 may first input a first bias voltage to the lower electrode 211, and may float the lower electrode 211 while inputting a second bias voltage to the upper electrode 216. An electric current may flow in the memory cell 210 as the second bias voltage is input to the upper electrode 216, in a state in which the lower electrode 211 is floating. In an embodiment, the memory control circuit 220 may charge a capacitor with an electric current flowing through the memory cell 210, and may compare a voltage of the capacitor with a reference voltage to discriminate data of the memory cell 210.

Figure 6:
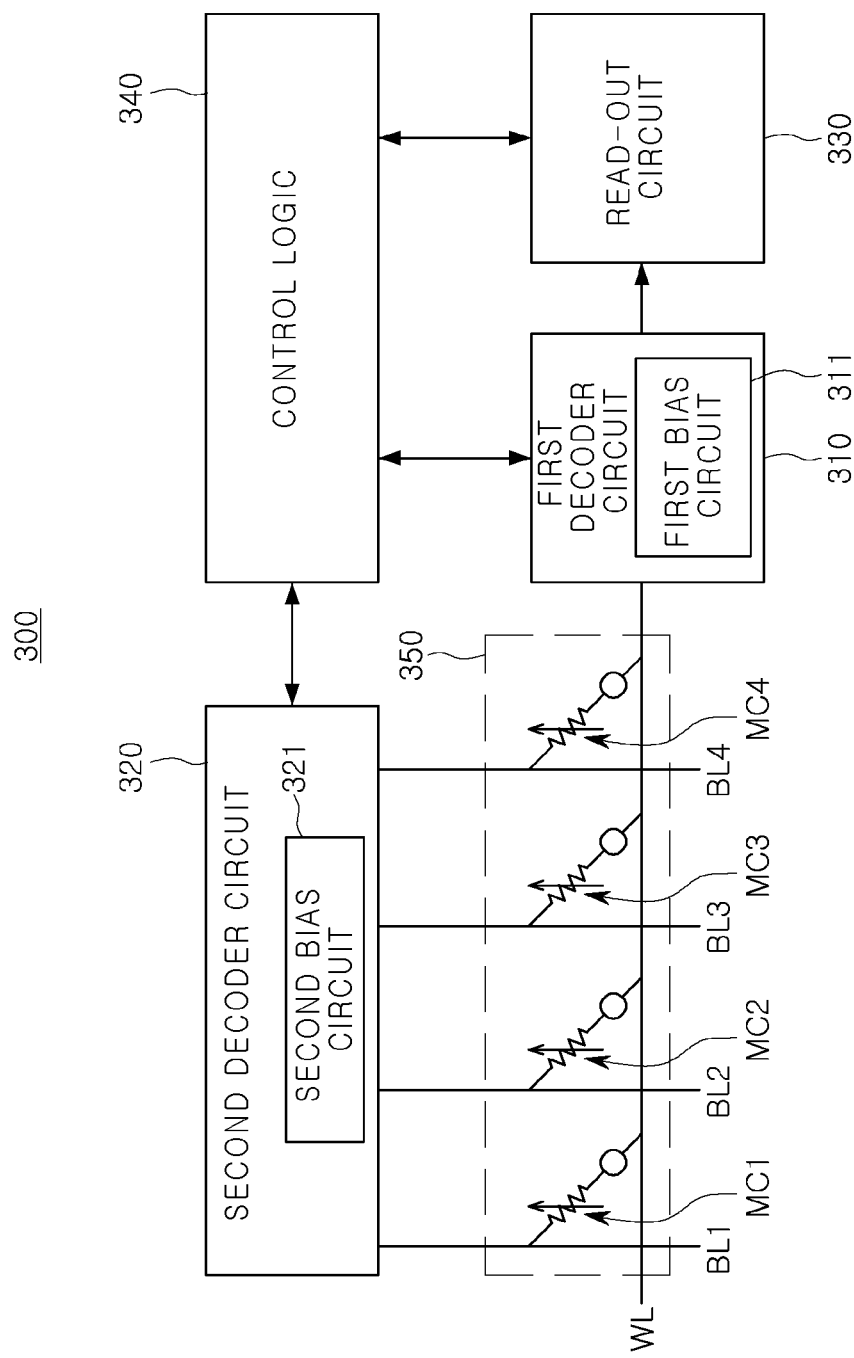
FIG. 6 is a view illustrating an operation of a memory device according to an embodiment of the present inventive concept.

FIG. 6 is a view illustrating an operation of a memory device according to an embodiment of the present inventive concept.

Referring to FIG. 6, a memory device 300 according to an embodiment of the present inventive concept may include a first decoder circuit 310, a second decoder circuit 320, a read-out circuit 330, a control logic 340, and a memory cell array 350. The memory cell array 350 may include a plurality of memory cells MC1 to MC4. The first decoder circuit 310 may be connected to the plurality of memory cells MC1 to MC4 through a word line WL, and the second decoder circuit 320 may be connected to the plurality of memory cells MC1 to MC4 through first to fourth bit lines BL1 to BL4. For convenience of explanation, in an embodiment of FIG. 6, only one word line WL is illustrated. The memory cell array 350 may include a plurality of word lines WL. In addition, the number of bit lines BL1 to BL4 and the number of memory cells MC1 to MC4 may be variously modified.

In the embodiment illustrated in FIG. 6, the read-out circuit 330 may read data of a selected memory cell among the memory cells MC1 to MC4. For example, when the fourth bit line BL4 is determined as a selected bit line, the first to third bit lines BL1 to BL3 may be non-selected bit lines. The first decoder circuit 310 may connect a first bias circuit 311 to the word line WL to input a first bias voltage, and the second decoder circuit 320 may connect a second bias circuit 321 to the fourth bit line BL4 to input a second bias voltage. The second bias voltage may be higher than the first bias voltage.

The second decoder circuit 320 may also input a third bias voltage, higher than the first bias voltage and lower than the second bias voltage, to unselected first to third bit lines BL1 to BL3. In one example, the third bias voltage may be a voltage of 0 V, the first bias voltage may be a negative voltage, and the second bias voltage may be a positive voltage. In one example, the second bias voltage may be a constant positive voltage (e.g., 2V). In an embodiment, absolute values of the first bias voltage and the second bias voltage may be equal to each other.

As described above, when the first to third bias voltage are input to the bit lines BL1 to BL4 and the word line WL, an electric current may flow only to a selected memory cell to which a relatively high voltage is input. The read-out circuit 330 may detect a read voltage corresponding to the electric current flowing in the selected memory cell, and compare the detected voltage with a reference voltage to determine a state of the selected memory cell as a set state or a reset state. For example, a capacitor included in the first decoder circuit 310 and/or the read-out circuit 330 may be charged by the electric current flowing through the selected memory cell, and the read-out circuit 330 may compare a voltage of the capacitor with the reference voltage to discriminate data of the selected memory cell.

When a time period of the electric current flowing in the selected memory cell in a reading operation is longer, data stored in the selected memory cell may be accurately discriminated and read failure may be minimized. However, when a time period of the electric current flowing in the selected memory cell in a reading operation is longer, read disturbance in which unintended phase transition occurs in the selected memory cell may occur. For example, when a threshold voltage of the selected memory cell is relatively low, probability of occurring the read disturbance may be relatively low, and probability of occurring the read failure may be relatively high. When a threshold voltage of the selected memory cell is relatively high, probability of occurring the read failure may be relatively low, and probability of occurring the read disturbance may be relatively high.

In an embodiment of the present inventive concept, after the first decoder circuit 310 inputs the first bias voltage to the word line WL, the second decoder circuit 320 may input second bias voltage to a selected bit line among the bit lines BL1 to BL4. When the second bias voltage starts to be input to the selected bit line and a predetermined delay time elapses, at least one of the switch elements connected between the first bias circuit 311 and the word line WL may turn off. Therefore, the read disturbance and the read failure may be minimized to realize a stable reading operation.

Figure 7:
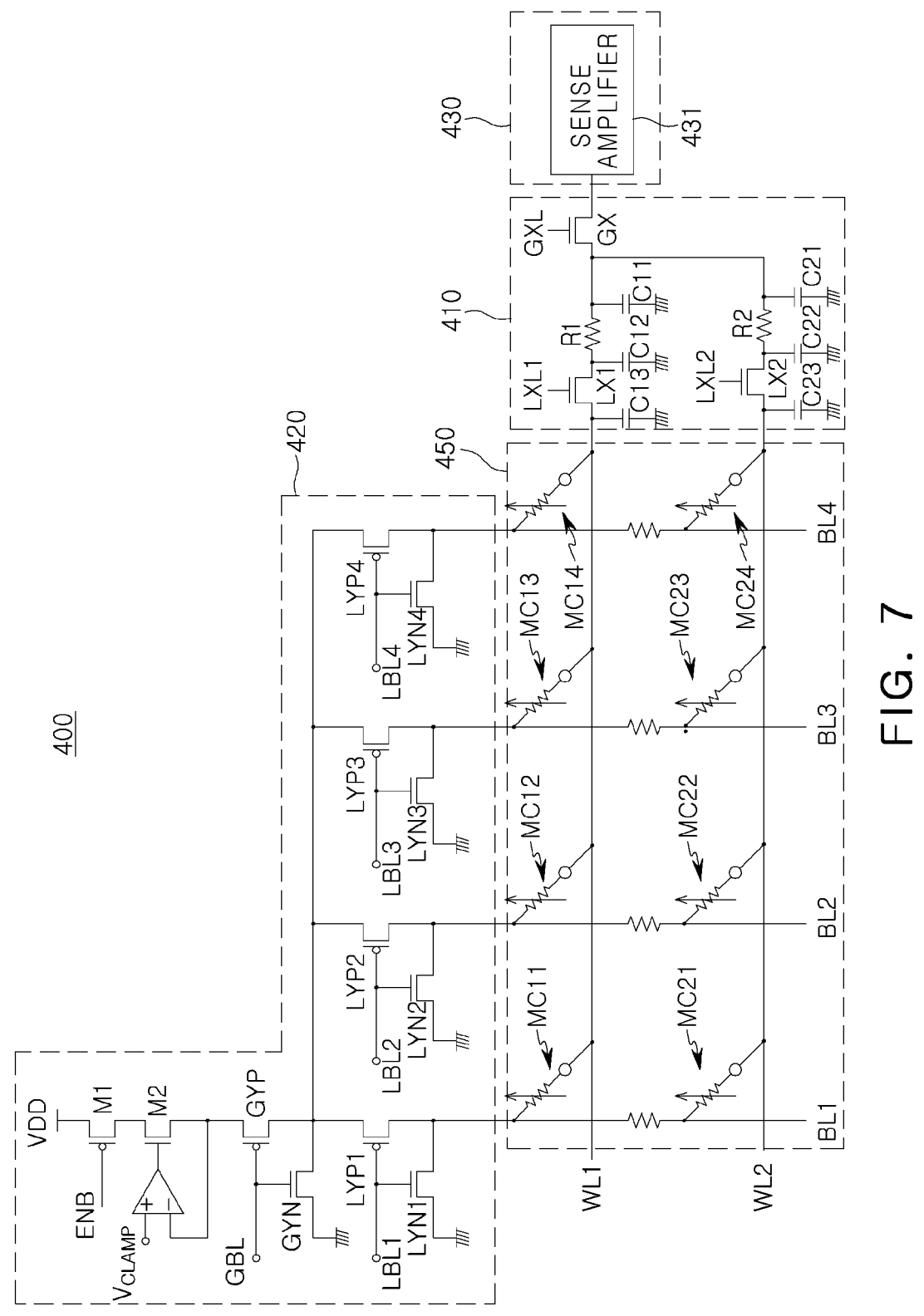

FIG. 7 is a circuit diagram illustrating an operation of a memory device according to an embodiment of the present inventive concept.

Referring to FIG. 7, a memory device 400 according to an embodiment of the present inventive concept may include a first decoder circuit 410, a second decoder circuit 420, a read-out circuit 430, a memory cell array 450, and the like. Although only two word lines WL1 and WL2 and four bit lines BL1 to BL4 are illustrated in the embodiment of FIG. 7, the number thereof may be variously changed. The memory cell array 450 may include memory cells MC11 to MC14, and MC21 to MC24 connected to the word lines WL1 and WL2, and the bit lines BL1 to BL4.

The first decoder circuit 410 may be connected to the word lines WL1 and WL2, and, for a reading operation, may determine one of the word lines WL1 and WL2 as a selected word line and input a first bias voltage to the selected word line. For example, the first bias voltage may be a negative voltage. The first bias circuit 311 (in FIG. 6) for inputting (or supplying) the first bias voltage may be connected between a second switch element GX and a sense amplifier 431. The first bias circuit 311 may supply the first bias voltage to the selected word line or float the selected word line by a control signal (not shown).

Each of the word lines WL1 and WL2 may be connected to at least one switch element included in the first decoder circuit 410. For example, the first word line WL1 may be connected to the sense amplifier 431 of the read-out circuit 430 through a first switch element LX1 and the second switch element GX. The second word line WL2 may be connected to the sense amplifier 431 through a first switch element LX2 and the second switch element GX.

In an embodiment illustrated in FIG. 7, the first word line WL1 and the second word line WL2 may share a single second switch element GX and a single sense amplifier 431. According to example embodiments, the first word line WL1 and the second word line WL2 may be connected to second switch elements GX and sense amplifiers 431, different from each other.

Referring to the second decoder circuit 420, each of bit lines BL1 to BL4 may be connected to a pair of switch elements. For example, the first bit line BL1 may be connected to a first selection switch element LYP1 and a first non-selection switch element LYN1. The first selection switch element LYP1 may be turned on when the first bit line BL1 is determined as being a selected bit line, and the first non-selection switch element LYN1 may be turned on when the first bit line BL1 is determined as a non-selected bit line. For example, the first selection switch element LYP1 may be a P-type metal oxide semiconductor (PMOS) transistor, and the first non-selection switch element LYN1 may be an N-type metal oxide semiconductor (NMOS) transistor. Gate terminals of the first selection switch element LYP1 and the first non-selection switch element LYN1 may commonly receive the first bit line control signal LBL1.

The bit lines BL1 to BL4 may share a common selection switch element GYP and a common non-selection switch element GYN. The common selection switch element GYP may be a PMOS transistor, and the common non-selection switch element GYN may be an NMOS transistor. Gate terminals of the common selection switch element GYP and the common non-selection switch element GYN may commonly receive a common bit line control signal GBL.

The sense amplifier 431 may include a capacitor, and may compare a voltage of the capacitor with a predetermined reference voltage. For example, the sense amplifier 431 may be implemented as an arithmetic amplifier, and a first input terminal of the arithmetic amplifier may be connected to the capacitor and the word lines WL1 and WL2, and a second input terminal thereof may be connected to the reference voltage.

Hereinafter, a reading operation for a selected memory cell MC11 will be described on the assumption that the first word line WL1 and the first bit line BL1 are selected as a selected word line and a selected bit line, respectively.

When the reading operation for the selected memory cell connected to the first bit line BL1 and the first word line WL1 is started, the first decoder circuit 410 may turn on the first switch element LX1 and the second switch element GX, connected to the first word line WL1, to input the first bias voltage to the first word line WL1. The first word line WL1 may be pre-charged by the first bias voltage. In this case, the first switch element LX2 connected to the second word line WL2 may be turned off.

When the first word line WL1 is pre-charged by the first bias voltage, the second decoder circuit 420 may use an enable signal ENB and a clamp voltage $V_{CLAMP}$ to turn on an enable element M1 and a clamp element M2. Also, the second decoder circuit 420 may turn on the common selection switch element GYP shared by the bit lines BL1 to BL4, may turn off the common non-selection switch element GYN, may turn on the first selection switch element LYP1 connected to the first bit line BL1, and may turn off the first non-selection switch element LYN1. The second decoder circuit 420 may also turn on the non-selection switch elements LYN2 to LYN4 connected to the second to fourth bit lines BL2 to BL4, and may turn off the selection switch elements LYP2 to LYP4. Therefore, the first bit line BL1 may receive a second bias voltage, and the second to fourth bit lines BL2 to BL4 may receive a ground voltage, as a third bias voltage.

When the second bias voltage starts to be input to the first bit line BL1, pre-charging for the first word line WL1 may be ended. For example, when the first decoder circuit 410 finishes the pre-charging for the first word line WL1, the second decoder circuit 420 may input the second bias voltage to the first bit line BL1.

When the second bias voltage is input to the first bit line BL1, the selected memory cell MC11 may be turned on to flow a sensing electric current through the selected memory cell MC11, and a charge capacitance of the first word line WL1, which may be a selected word line, may be charged by the sensing electric current. The capacitor of the sense amplifier 431 may be charged by receiving an electric charge from the first word line WL1 charged by the sensing electric current. Therefore, when the charge capacitance of the first word line WL1 connected to the selected memory cell MC11 increases, sensing margin of the selected memory cell MC11 may be improved, and the read fail may be prevented.

As the charge capacitance of the first word line WL1 connected to the selected memory cell MC11 increases, the sensing electric current may increase. Therefore, the read disturb may occur when the selected memory cell MC11 has a set state. For example, when the selected memory cell MC11 has a set state, phase transition of an information storage element included in the selected memory cell MC11 to the amorphous phase may occur by increase of the sensing electric current. Therefore, the charge capacitance of the first word line WL1 connected to the selected memory cell MC11 may be desire to reduce to prevent the read disturbance of the selected memory cell MC11.

In an embodiment of the present inventive concept, at least one of the first switch element LX1 and the second switch element GX may be maintained in a turned-on state, during a predetermined delay time after the pre-charging for the first word line WL1 is ended. When the delay time elapses, at least one of the first switch element LX1 and the second switch element GX that has been maintained in the turned-on state during the delay time may be turned off.

During the delay time, the first word line WL1 may be connected to at least one of first, second and third capacitors C11, C2 and C13 through the first switch element LX1 and a first resistance R1. Therefore, a charge capacitance of the first word line WL1 connected to the selected memory cell MC11 during the delay time may be greater than a charge capacitance of the first word line WL1 connected to the selected memory cell MC11 after the delay time elapses.

Although not shown, a third resistance R3 connected to fourth and fifth capacitors C14 and C15 are located between the second switch element GX and the sense amplifier 431. Herein, the respective capacitors C11 to C15 and the respective resistances R1 and R3 are parasitic capacitances and parasitic resistances.

When a threshold voltage of the selected memory cell MC11 is relatively low and a sensing margin is relatively small, the selected memory cell MC11 may be turned on for the delay time. Since the sensing electric current through the selected memory cell MC11 starts to flow during the delay time when the first word line WL1 has a relatively high charge capacitance, sensing margin of the selected memory cell MC11 may be improved, and the read fail may be prevented.

When a threshold voltage of the selected memory cell MC11 is relatively high, the selected memory cell MC11 may be turned on after the delay time elapses. Since the selected memory cell MC11 may be turned on and the sensing electric current may flow only when the first word line WL1 has a relatively low charge capacitance, the read disturb of the selected memory cell MC11 may be prevented.

Figure 8:
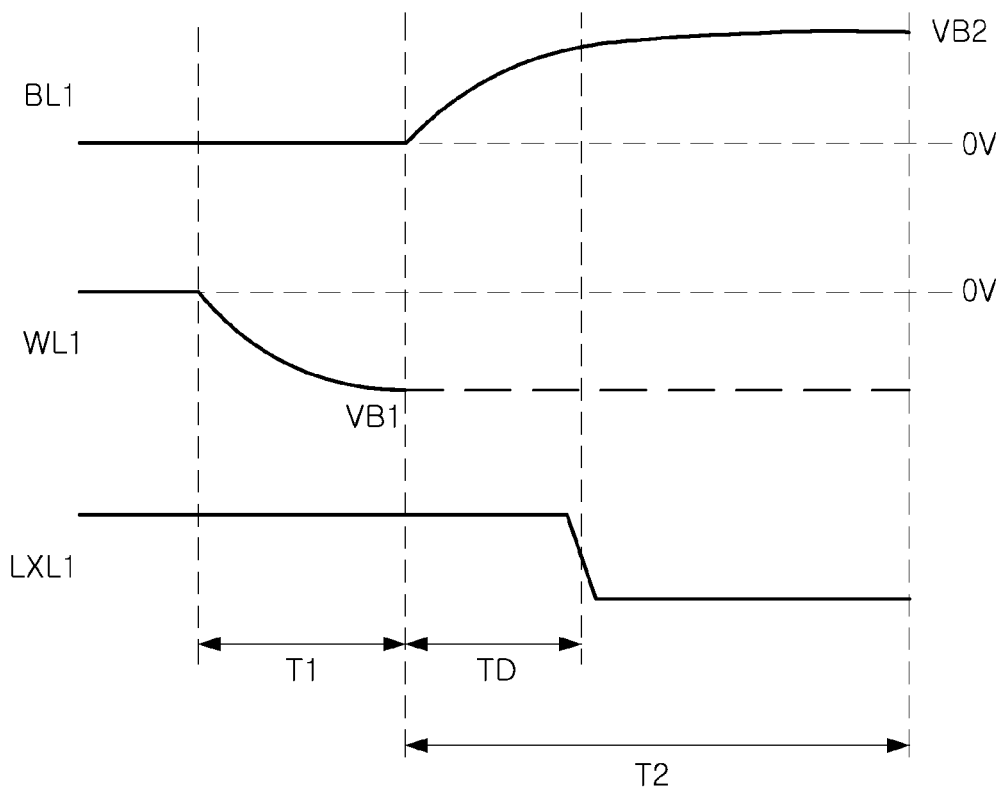
FIG. 8 is a timing diagram illustrating a reading operation of a memory device according to an embodiment of the present inventive concept.
Figure 9A:
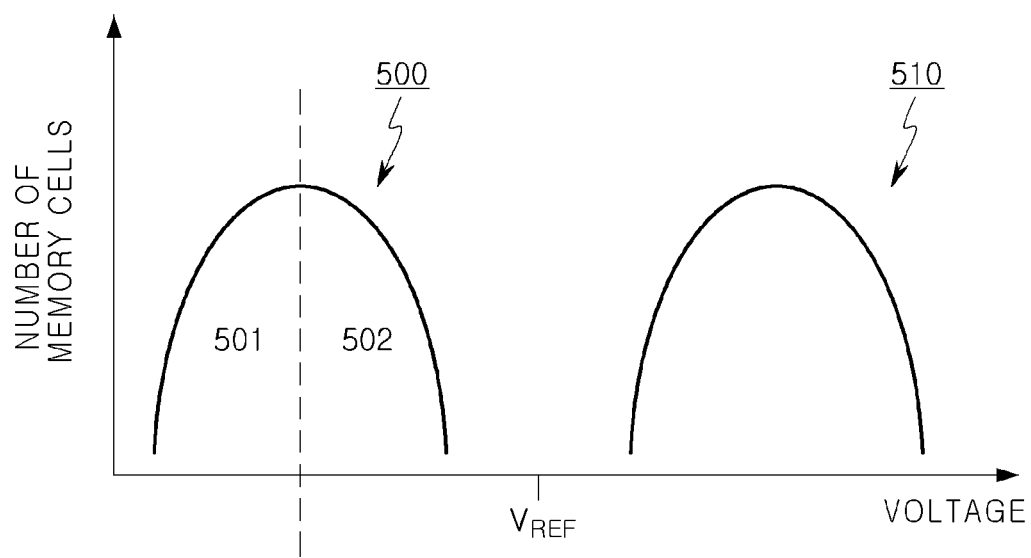
FIGS. 9A to 9C are graphs illustrating a reading operation of a memory device according to an embodiment of the present inventive concept.
Figure 9B:
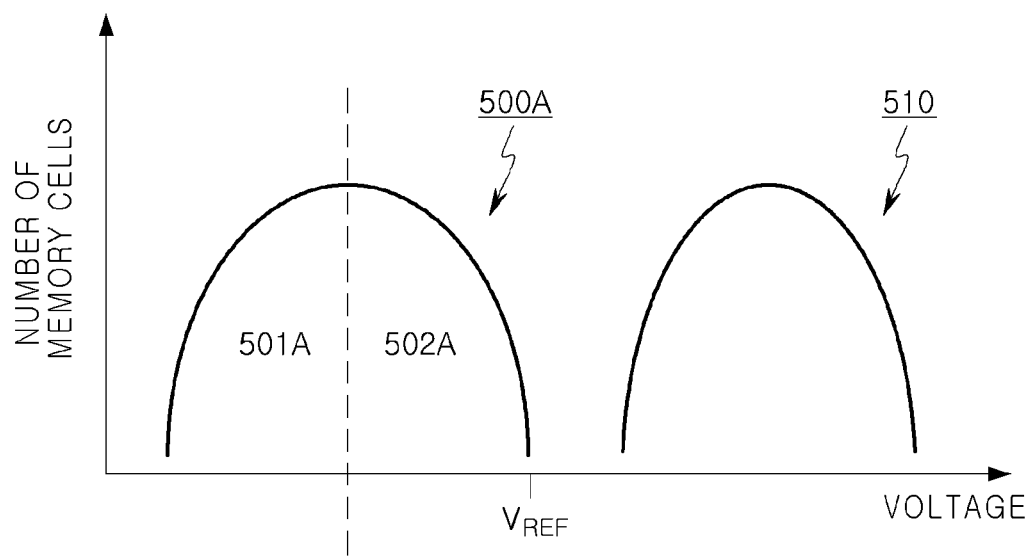
Figure 9C:
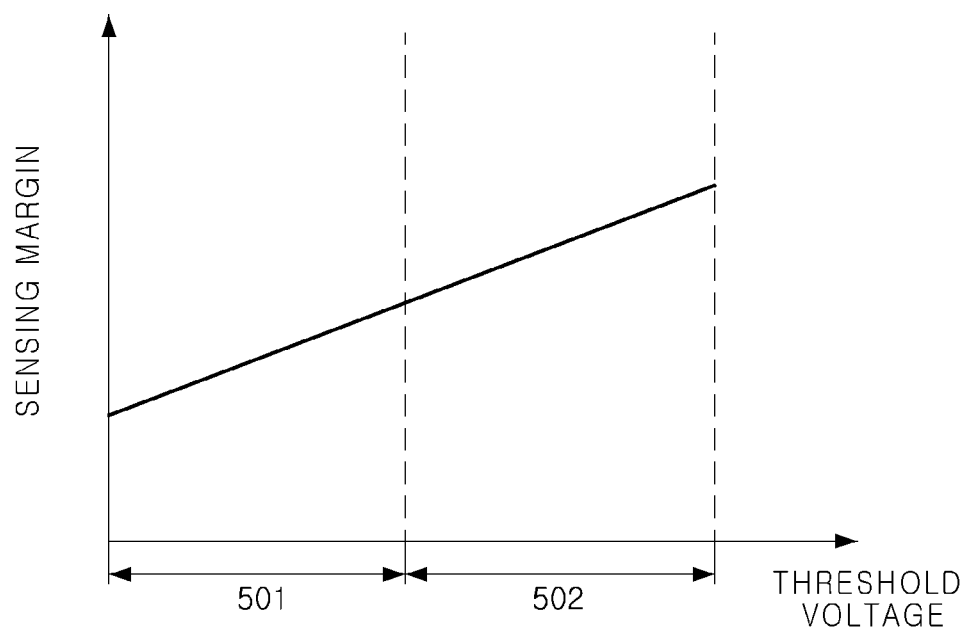

FIG. 8 is a timing diagram illustrating a reading operation of a memory device according to an embodiment of the present inventive concept. FIGS. 9A to 9C are graphs illustrating a reading operation of a memory device according to an embodiment of the present inventive concept.

Hereinafter, the memory device 400 illustrated in FIG. 7 will be described together. Referring first to FIG. 8, a first bias voltage VB1 may be input to a selected word line WL1, and a second bias voltage VB2 may be input to a selected bit line BL1. The selected word line WL1 and the selected bit line BL1 may be a word line of the plurality of word lines WL and a bit line of the plurality of bit lines BL, connected to a selected memory cell MC11 to which data is to be read, respectively. Selections of the selected memory cell MC11 and the selected word line WL1 and the selected bit line BL1 may be examples, and may be variously changed. The selected word line WL1 may be pre-charged by the first bias voltage VB1 input to the selected word line WL1 during a first period of time T1.

When the selected word line WL1 is pre-charged by the first bias voltage VB1, the second bias voltage VB2 may be input to the selected bit line BL1. For example, when the first period of time T1 elapses and a second period of time T2 starts, the second bias voltage VB2 may be input to the selected bit line BL. Hereinafter, the selected word line WL1 may be disconnected (or, floated) from the first bias circuit after the first period of time T1 elapses (shown as dashed line), and the second bias voltage VB2 may be input to a selected bit line (e.g., BL1) when the second period of time T2 starts. Although not shown, if the selected memory cell has a set state a voltage level of the floated word line may gradually increase after the second bias voltage VB2 is supplied to the selected bit line BL1.

In an embodiment of the present inventive concept, a control signal LXL1 for controlling a first switch element LX1 connected to the selected word line WL1 may turn off the first switch element LX1 when a predetermined delay time TD elapses after the second period of time T2 starts. Although not shown, a second switch element GX is connected between the first switch element LX1 and the first bias circuit 311. The second switch element GX may be turned on when the first switch element LX1 turns off. Therefore, a charge capacitance of the selected word line WL1 during the delay time TD may be greater than a charge capacitance of the selected word line WL1 during the second period of time T2 except for the delay time TD. For example, the delay time TD may be defined as a transition time at which the second bias voltage VB2 input to the selected bit line BL1 increases. At an end point of the delay time TD, a voltage of the selected bit line BL1 may have a magnitude of about 70% to 80% of the second bias voltage VB2.

First, referring to FIG. 9A, a threshold voltage distribution of memory cells may be classified in accordance with a state of an information storage element included in the memory cells. Set state distribution 500 corresponding to threshold voltages of memory cells having a set state may be smaller than reset state distribution 510 corresponding to threshold voltages of memory cells having a reset state. A reference voltage $V_{REF}$ may be set to have a value higher than the set state distribution 500 and lower than the reset state distribution 510, and the sense amplifier 431 of the memory control circuit may compare data of the selected memory cell MC11 with the reference voltage $V_{REF}$ detected by the selected memory cell MC11 among memory cells to discriminate the data of the selected memory cell MC11.

The set state distribution 500 may be divided into a first region 501 and a second region 502. A memory cell having a threshold voltage belonging to the first region 501 may have relatively small sensing margin and relatively large read disturb margin. A memory cell belonging to the second region 502 may have relatively large sensing margin and relatively small read disturb margin.

FIG. 9B may be a graph illustrating threshold voltage change according to read disturb which may occur in a reading operation. Referring to FIG. 9B, a threshold voltage of a selected memory cell MC11 having a set state may increase by read disturb, and set state distribution 500A may be shifted to the right. In this case, influence of an increase in the threshold voltage may be relatively larger in a second region 502A than in a first region 501A. For example, when the threshold voltage of the selected memory cell MC11 is included in the second region 502A, the threshold voltage may increase to a reference voltage $V_{REF}$ by read disturb, and the selected memory cell MC11 may be evaluated to have relatively small read disturb margin. When the threshold voltage of the selected memory cell MC11 is included in the first region 501A, a difference between the threshold voltage and the reference voltage $V_{REF}$ may be maintained at a certain level or more, even when read disturb occurs. Therefore, the selected memory cell MC11 may be evaluated to have relatively large read disturb margin.

FIG. 9C may be a graph illustrating a sensing margin of a memory cell having a set state. Referring to FIG. 9A together with FIG. 9C, a memory cell in which a threshold voltage belongs to a first region 501 of set state distribution 500 may have a relatively small sensing margin. In addition, a memory cell having a threshold voltage belonging to a second region 502 may have a relatively large sensing margin.

Referring to FIGS. 7 and 8 again, in an embodiment of the present inventive concept, the first switch element LX1 connected to the selected word line WL1 by the control signal LXL1 may be maintained in a turned-on state, when the second bias voltage VB2 is input to the selected bit line BL1 and during a predetermined delay time TD. Therefore, a charge capacitance of the selected word line WL1 during the delay time TD may be greater than a charge capacitance of the selected word line WL1 during the second period of time T2 except for the delay time TD.

If the selected memory cell MC11 has a set state and the threshold voltage is relatively low, e.g., the threshold voltage of the selected memory cell is included in the first area 501 of FIG. 9A, the selected memory cell MC11 may have a relatively small sensing margin and a relatively large read disturb margin. The selected memory cell MC11 with a relatively low threshold voltage may be turned on within the delay time TD, and electric current may flow in the selected word line WL1 through the selected memory cell MC11, while the selected word line WL1 has a relatively high charge capacitance. Therefore, the sensing margin of the selected memory cell MC11 may be improved, and read fail may be prevented. The time period for the electric current to flow through the selected memory cell MC11 increases, but the read disturb may not occur because the selected memory cell MC11 has large read disturb margin.

Next, if the threshold voltage of the selected memory cell MC11 is included in the second region 502 of FIG. 9A, the selected memory cell MC11 may have relatively large sensing margin and relatively small read disturb margin. The selected memory cell MC11 having a relatively high threshold voltage may be turned on after the delay time TD elapses, and the selected memory cell MC11 may be turned on to flow electric current through the selected word line WL1, only while the selected word line WL1 has a relatively low charge capacitance. Therefore, since the time period for the electric current to flow through the selected memory cell MC11 may be reduced, the problem caused by the read disturb may be solved. Further, since the selected memory cell MC11 has good sensing margin, the read fail may not occur.

Figure 10:
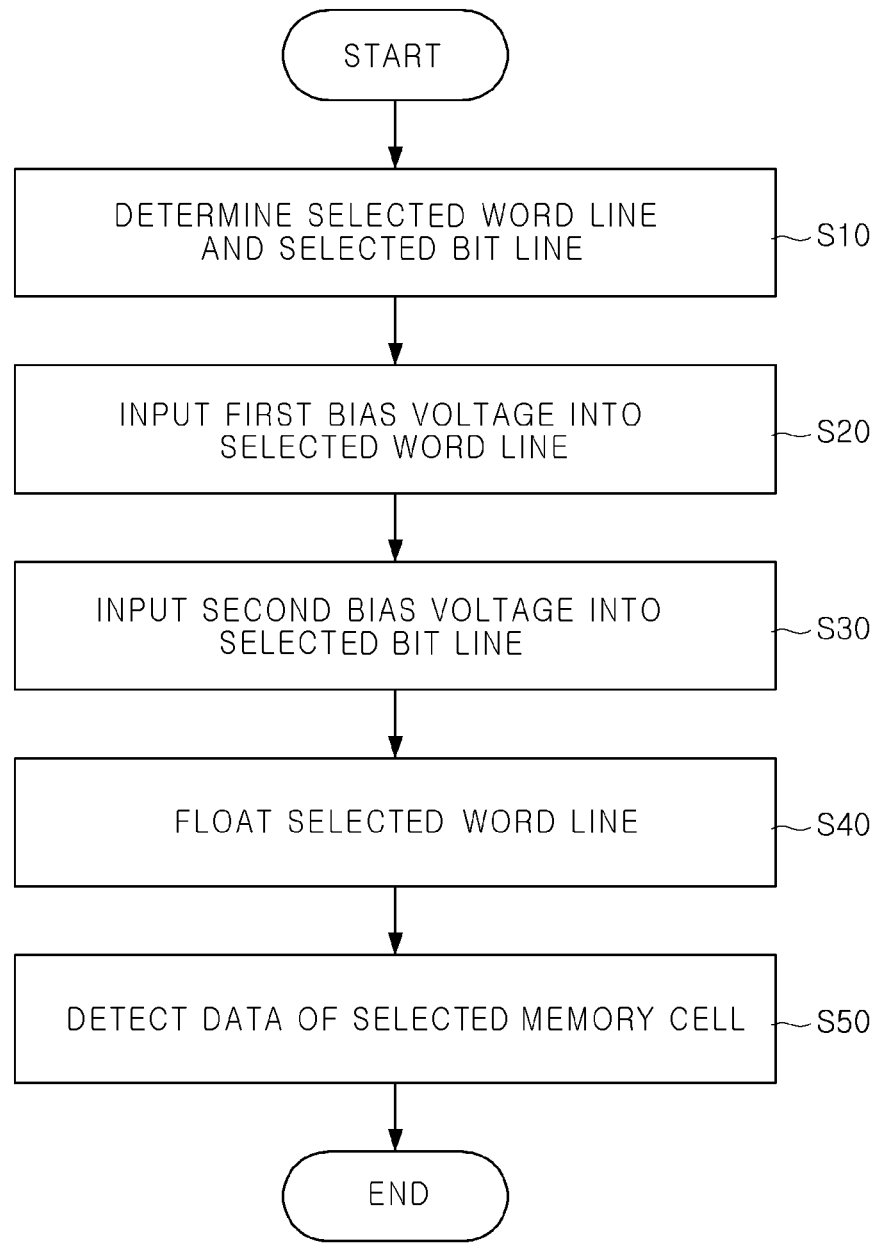
FIG. 10 is a flowchart illustrating a reading operation of a memory device according to an embodiment of the present inventive concept.

FIG. 10 is a flowchart illustrating a reading operation of a memory device according to an embodiment of the present inventive concept.

Referring to FIG. 10, a reading operation of a memory device according to an exemplary embodiment of the present inventive concept may include determining a selected word line among a plurality of word lines, and determining a selected bit line among a plurality of bit lines (S10). The selected word line and the selected bit line may be a word line and a bit line, connected to a selected memory cell to which data is to be read.

The memory control circuit may input the first bias voltage to the selected word line (S20). The first bias voltage may be a negative voltage. Next, the memory control circuit may input a second bias voltage to the selected bit line (S30). The second bias voltage may be a positive voltage, and absolute values of the first bias voltage and the second bias voltage may be equal to each other. After the first bias voltage is input to the selected word line and a predetermined time elapses, a second bias voltage may be input to the selected bit line.

Next, the memory control circuit may float the selected word line (S40). The memory control circuit may separate the selected word line from the first bias circuit outputting the first bias voltage, to float the selected word line. Timing at which the selected word line is floated may vary according to example embodiments. In one example, the selected word line may be floated immediately after the second bias voltage starts to be input and after a predetermined delay time elapses, or the second bias voltage may be input without the predetermined delay time. The memory control circuit may cause the selected word line to float by turning off at least one of switch elements between the selected word line and the first bias circuit.

The memory control circuit may detect data of the selected memory cell (S50). The memory control circuit may detect a first voltage corresponding to electric current flowing in the selected word line by connecting the selected word line to a read-out circuit after the second bias voltage is inputted and the predetermined time elapses. The memory control circuit may compare the first voltage with a predetermined reference voltage. When the first voltage is lower than the reference voltage, the memory control circuit may discriminate a state of the selected memory cell as a set state. When the first voltage is higher than the reference voltage, the memory control circuit may discriminate a state of the selected memory cell as a reset state.

FIGS. 11 to 14 are timing diagrams illustrating a reading operation of a memory device according to example embodiments of the present inventive concept.

Referring to FIGS. 11 to 14, a first bias voltage VB1 may be input to a selected word line WL, and a second bias voltage VB2 may be input to a selected bit line BL. The first bias voltage VB1 may be a negative voltage, and the second bias voltage VB2 may be a positive voltage. The selected word line WL may be pre-charged by the first bias voltage VB1 input to the selected word line WL during a first period of time T1.

When the selected word line WL is pre-charged by the first bias voltage VB1, the second bias voltage VB2 may be input to the selected bit line BL. For example, when the first period of time T1 elapses and a second period of time T2 starts, the second bias voltage VB2 may be input to the selected bit line BL. Further, in an embodiment, when the second period of time T2 elapses, the input of the second bias voltage VB2 may be ended, the selected bit line BL may be floated, and the selected bit line BL and the selected word line WL may be developed.

In embodiments described with reference to FIGS. 11 to 14, two or more switch elements may be connected to a selected word line WL. The switch elements may include a first switch element and a second switch element, and the first switch element may be connected in series between the second switch element and the selected word line WL. A first control signal LXL for the first switch element and a second control signal GXL for the second switch element may be illustrated in FIGS. 11 to 14. The first switch element and the second switch element may be connected between a first bias circuit outputting a first bias voltage VB1 and the selected word line WL.

Figure 11:
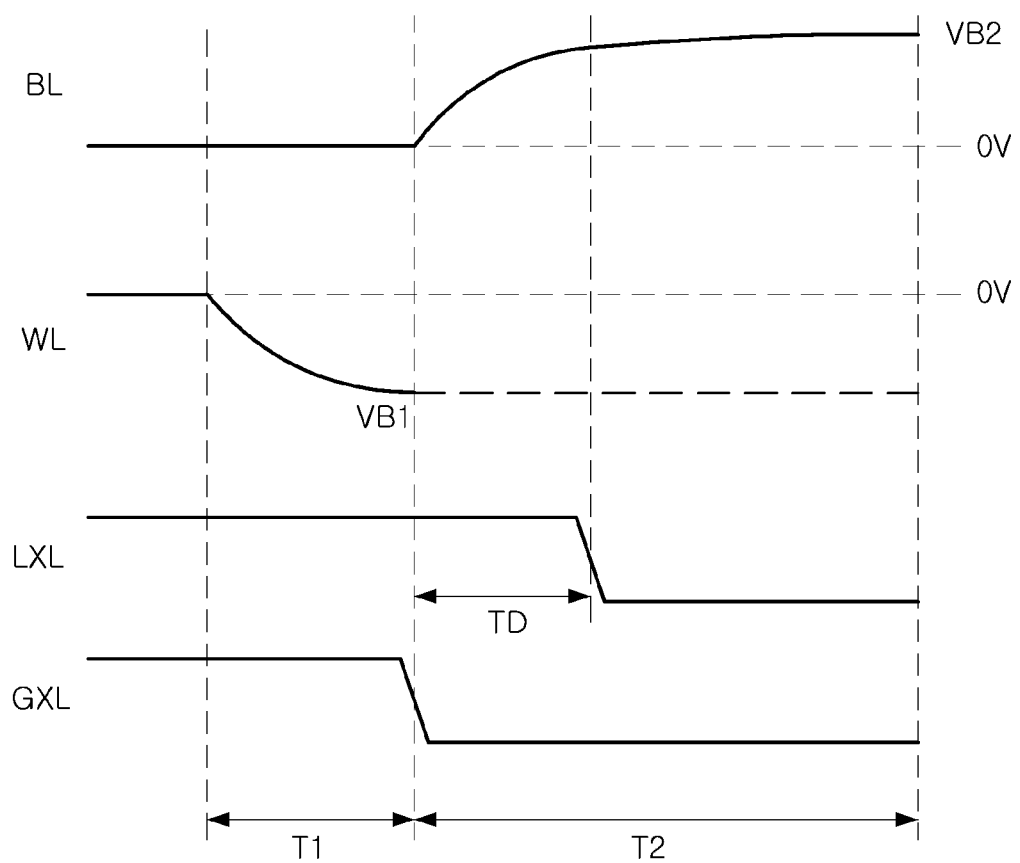
FIGS. 11 to 14 are timing diagrams illustrating a reading operation of a memory device according to an embodiment of the present inventive concept.

Referring first to FIG. 11, a second period of time T2 may be started, and a second switch element may be turned off by a second control signal GXL. A first switch element may be maintained in a turned-on state during a delay time TD, and may be turned off after the delay time TD elapses. During the delay time TD, a charge capacitance of a selected word line WL may have a relatively large value by the first switch element maintaining the turned-on state. In an embodiment illustrated in FIG. 11, since the second switch element is turned off after the first period of time T1 elapses, the selected word line WL may be floated immediately after the first period of time T1 elapses.

In an embodiment illustrated in FIG. 11, the first switch element may be turned off while the selected word line WL is being floated. Also, the first switch element may be turned off after the selected word line WL is floated and the delay time TD elapses. In some examples, the first switch element may be turned off before the floating of the selected word line WL is ended.

The first switch element may maintain the turned-off state for a development time during which the selected word line WL is developed after the second period of time T2 elapses. In some examples, the selected word line WL is developed during the second period of time T2. In an embodiment, when the development time elapses, the first and second switch elements may be turned on, and the selected word line WL and the read-out circuit may be connected to each other. In an embodiment, when the development time starts, the first and second switch elements may be turned on, and the selected word line WL and the read-out circuit may be connected to each other. According to example embodiments, before the development time completely elapses, the first and second switch elements may be turned on, such that the selected word line WL and the read-out circuit may be connected to each other.

When the threshold voltage of the selected memory cell is relatively low, the selected memory cell may be turned on within the delay time TD, and the electric current flowing in the selected memory cell may be charged to the selected word line WL to have a relatively high charge capacitance. Therefore, the turn-on time of the selected memory cell having a relatively low threshold voltage and relatively small sensing margin may increase, and the read fail may be prevented. Further, when the threshold voltage of the selected memory cell is relatively high, the selected memory cell may be turned on after the delay time TD elapses, such that the period of turn-on time of the selected memory cell may be reduced. Therefore, the read disturb may be prevented by reducing the period of turn-on time of the selected memory cell having a relatively high threshold voltage.

Figure 12:
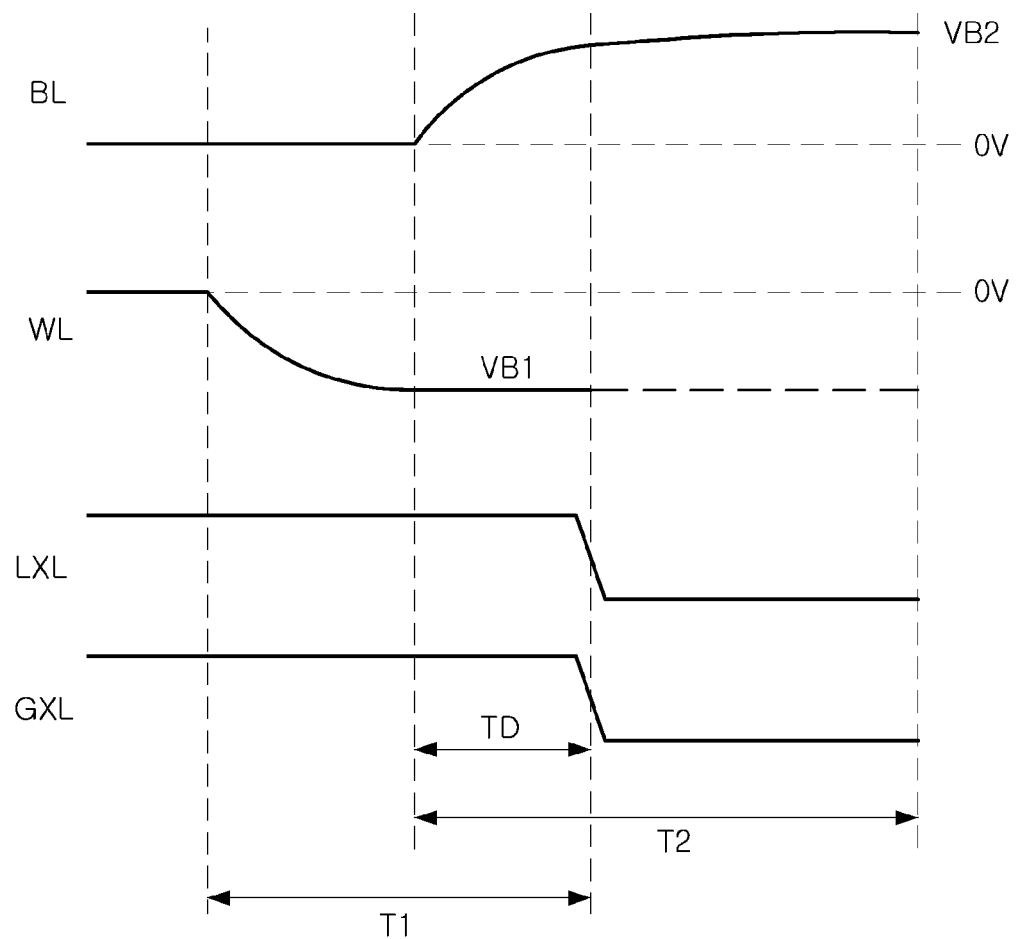

Next, referring to FIG. 12, a first bias voltage VB1 may be input to a selected word line WL during a first period of time T1, and a second bias voltage VB2 may be input to a selected bit line BL during a second period of time T2. A first switch element and a second switch element may both remain in turned-on states when the second period of time T2 starts and during a predetermined delay time TD. Therefore, at least a portion of the first period of time T1 and the second period of time T2 may overlap each other. For example, the delay time TD may be a period of time included in both the first time period of T1 and the second period of time T2.

When the delay time TD elapses, the first switch element and the second switch element may be turned off together. The selected memory cell having a relatively low threshold voltage may be turned on during the delay time TD, and the electric current flowing through the selected memory cell may be charged to the selected word line WL to have a relatively high charge capacitance. Therefore, the sensing margin of the selected memory cell may be improved. Since the first switch element and the second switch element is turned off together after the delay time TD lapses, the selected word line WL may be not floated during the delay time TD, and may be floated after the delay time TD lapses.

A selected memory cell having a relatively high threshold voltage may be turned on later than a selected memory cell having a relatively low threshold voltage. Therefore, since a period of turn-on time of the selected memory cell having a relatively high threshold voltage is shortened, and the time period for the electric current to flow is also shortened, the read disturb may be prevented.

Figure 13:
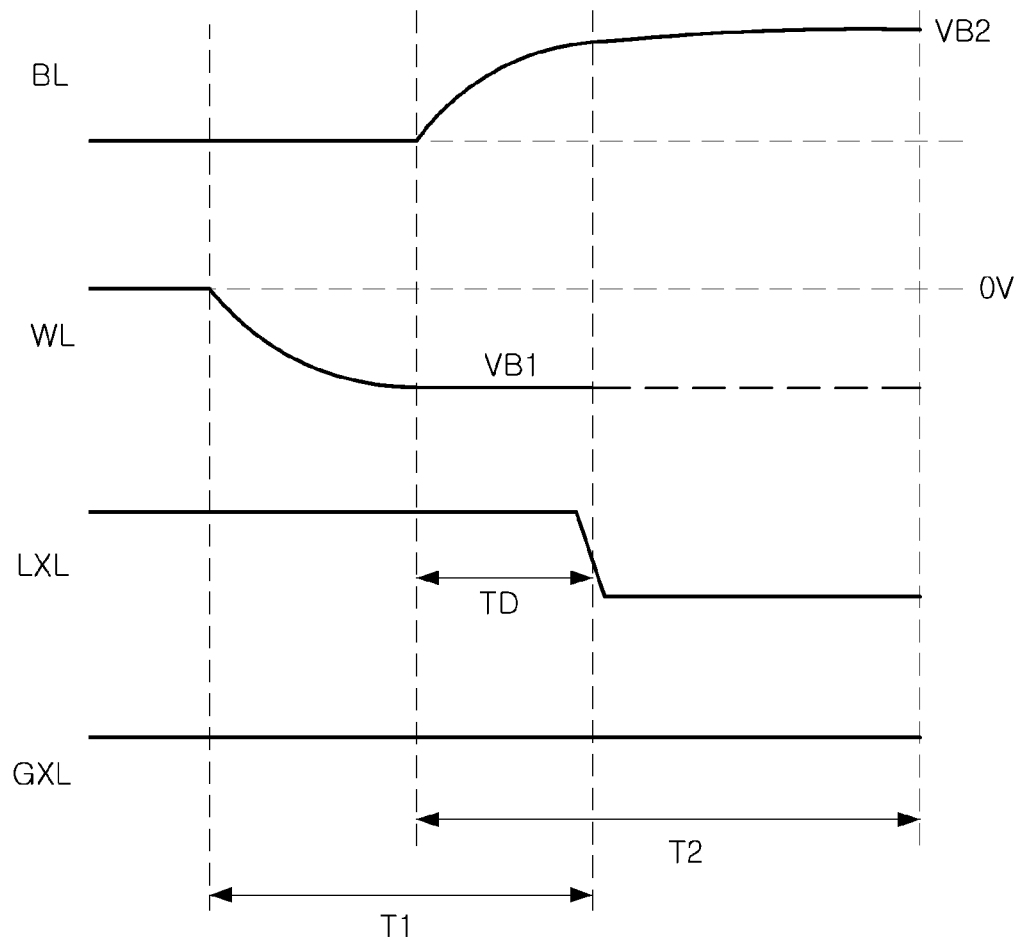

Next, referring to FIG. 13, a first bias voltage VB1 may be input to a selected word line WL during a first period of time T1, and a second bias voltage VB2 may be input to a selected bit line BL during a second period of time T2. In a similar manner to the embodiment illustrated in FIG. 12, a first switch element and a second switch element may both be maintained in a turned-on state during which the second period of time T2 starts and during a predetermined delay time TD. Therefore, at least a portion of the first period of time T1 and the second period of time T2 may overlap each other. Since the first switch element and the second switch element both are remained in the turned-on state during the delay time TD, the selected word line WL may not be floated until the delay time TD.

When the delay time TD elapses, the first switch element may be turned off. A selected memory cell having a relatively low threshold voltage may be turned on within the delay time TD, and a selected memory cell having a relatively high threshold voltage may be turned on relatively later. For example, a selected memory cell having a relatively high threshold voltage may be turned on after the delay time TD elapses. Therefore, sensing margin of the selected memory cell having a relatively low threshold voltage may be improved, and read disturbance in the selected memory cell having a relatively high threshold voltage may be minimized.

Figure 14:
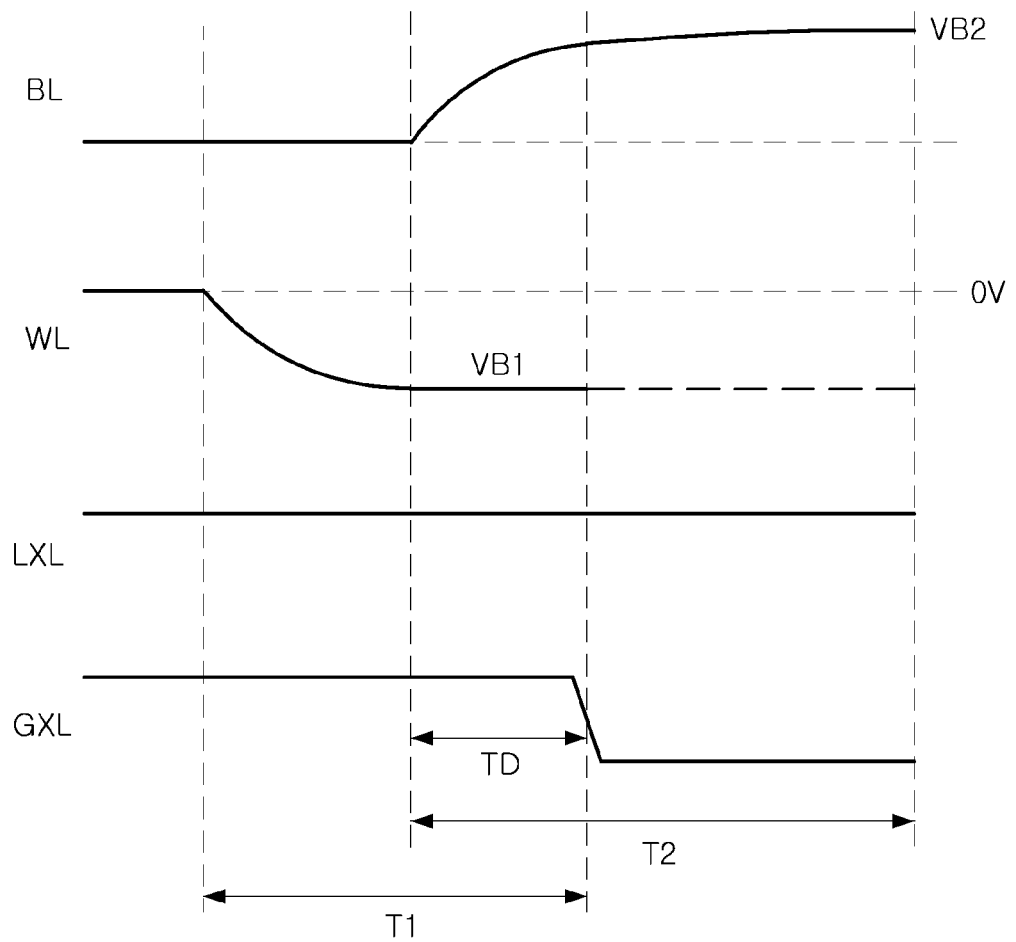

Referring to FIG. 14, a first bias voltage VB1 may be input to a selected word line WL during a first period of time T1, and a second bias voltage VB2 may be input to a selected bit line BL during a second period of time T2. In a similar manner to the embodiments illustrated in FIGS. 12 and 13, a first switch element and a second switch element may both be maintained in a turned-on state during which the second period of time T2 starts and during a predetermined delay time TD. Therefore, it can be understood that at least a portion of the first period of time T1 and the second period of time T2 overlap each other. Also, the selected word line WL may not be floated until the delay time TD.

When the delay time TD elapses, the second switch element may be turned off. A selected memory cell having a relatively low threshold voltage may be turned on within the delay time TD, and a selected memory cell having a relatively high threshold voltage may be turned on relatively later. For example, a selected memory cell having a relatively high threshold voltage may be turned on after the delay time TD elapses. Therefore, sensing margin of the selected memory cell having a relatively low threshold voltage may be improved, and read disturbance in the selected memory cell having a relatively high threshold voltage may be minimized.

According to example embodiments, the first switch element may be turned off after the selected word line WL is floated by the second switch element turning off after the delay time TD elapses. In one example, the first switch element may be turned off later than the second switch element. Alternatively, when the second period of time T2 is ended and the selected bit line BL is floated to start a development time, the first switch element may be turned off. Before the development time is ended, or before the development time is completely ended, the first switch element may be turned on again to connect the selected word line WL to a read-out circuit.

Figure 15:
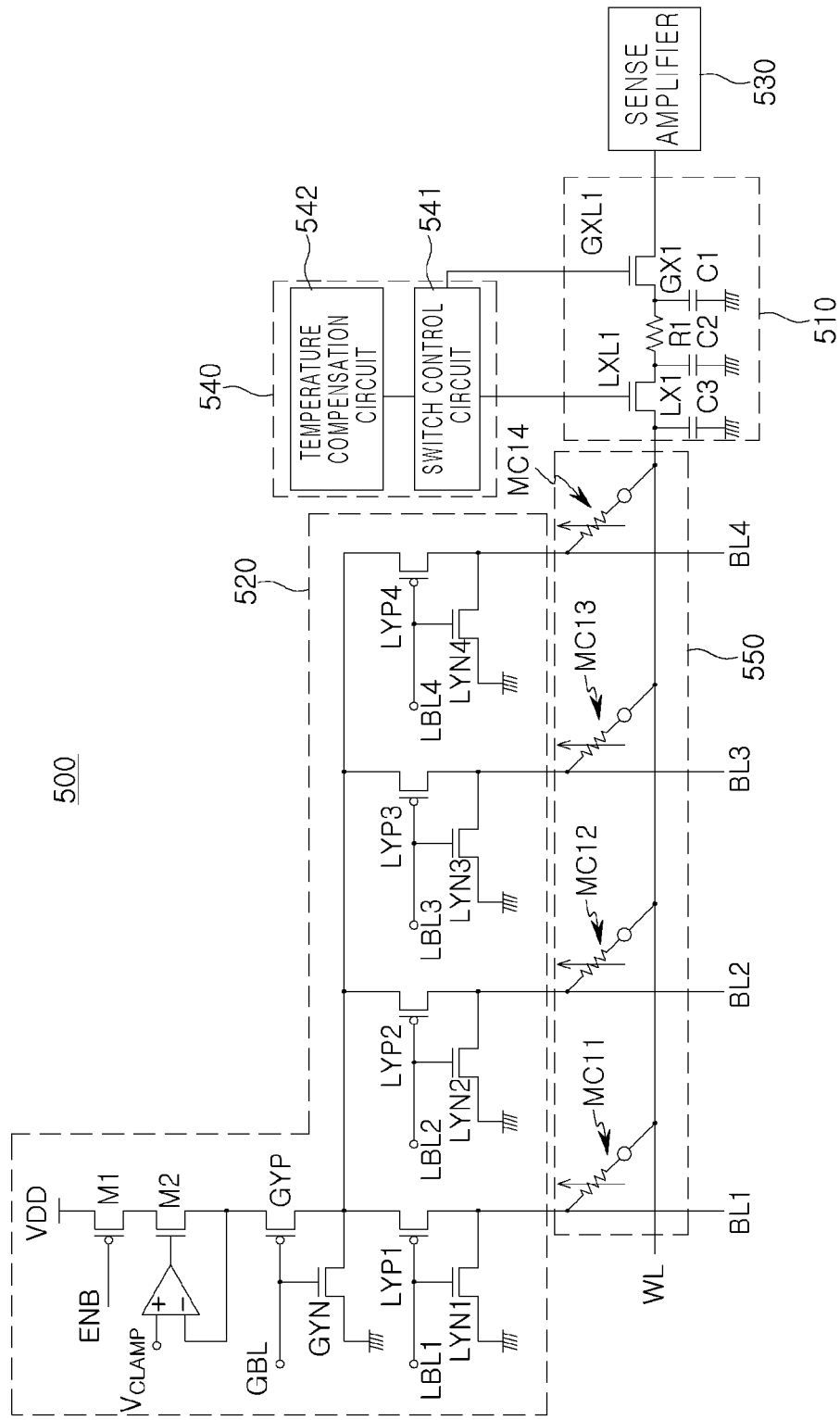
FIG. 15 is a circuit diagram illustrating an operation of a memory device according to an embodiment of the present inventive concept.

FIG. 15 is a circuit diagram illustrating an operation of a memory device according to an embodiment of the present inventive concept.

Referring to FIG. 15, a memory device 500 according to an embodiment of the present inventive concept may include a first decoder circuit 510, a second decoder circuit 520, a read-out circuit 530, a control logic 540, a memory cell array 550, and the like. Although only one word line WL and four bit lines BL1 to BL4 are illustrated in the embodiment of FIG. 15, the number thereof may be variously changed. The memory cell array 550 may include memory cells MC11 to MC14, connected to the word line WL and the bit lines BL1 to BL4.

The first decoder circuit 510 may include a first switch element LX1, a second switch element GX1, and a plurality of capacitors C1 to C3, connected to the word line WL. The first switch element LX1 and the second switch element GX1 may be connected between the word line WL and a sense amplifier 530 included in the read-out circuit.

In a reading operation in which one of the memory cells MC11 to MC14 is selected and data is read, the first decoder circuit 510 may input a first bias voltage to the word line WL. For example, the first bias voltage may be a negative voltage. A circuit for inputting the first bias voltage may be implemented as an electric current source connected between the second switch element GX1 and the sense amplifier 530, or the like.

The bit lines BL1 to BL4 may be connected to the second decoder circuit 520. Configuration and operation of the second decoder circuit 520 may be similar to the second decoder circuit 420 described above with reference to FIG. 7.

The control logic 540 may include a switch control circuit 541 and a temperature compensation circuit 542. The switch control circuit 541 may output a first control signal LXL1 and a second control signal GXL1 for controlling an on/off operation of the first switch element LX1 and the second switch element GX1 included in the first decoder circuit 510. The temperature compensation circuit 542 may detect an operating temperature of the memory device 500.

For example, characteristics of the memory cells MC11 to MC14 may vary depending on the operating temperature of the memory device 500. As the operating temperature of the memory device 500 decreases, a threshold voltage and sensing margin of the memory cells MC11 to MC14 may increase, and read disturb margin may decrease. When the operating temperature of the memory device 500 increases, a threshold voltage and sensing margin of the memory cells MC11 to MC14 may decrease, and read disturb margin may increase.

The switch control circuit 541 may pre-charge the word line WL by the first bias voltage by turning on the first switch element LX1 and the second switch element GX1 in the reading operation. When the word line WL is charged by the first bias voltage, at least one of the first switch element LX1 and the second switch element GX1 may be turned off. In an embodiment, the switch control circuit 541 may control an on/off timing operation of the first switch element LX1 and the second switch element GX1 connected to the word line WL, or a magnitude of a turn-off voltage input to at least one of the first switch element LX1 and the second switch element GX1, and the like, based on the operation temperature detected by the temperature compensation circuit 542.

For example, when the operating temperature decreases, the switch control circuit 541 may reduce the turn-off timing of at least one of the first switch element LX1 and the second switch element GX1. Alternatively, the magnitude of the second bias voltage input to the selected bit line among the bit lines BL1 to BL4 may decrease. When the operating temperature increases, the switch control circuit 541 may delay the turn-off timing operation of at least one of the first switch element LX1 and the second switch element GX1. Alternatively, the magnitude of the second bias voltage input to the selected bit line among the bit lines BL1 to BL4 may increase.

A time period required for the word line WL connected to the selected memory cell to have a relatively high charge capacitance may be shortened by advancing the turn-off timing operation of at least one of the first switch element LX1 and the second switch element GX1. Therefore, in accordance with an increase in the threshold voltage of the selected memory cell due to a decrease in the operating temperature, read disturb may be prevented. An effect such as the prevention of read disturb may be obtained by reducing the magnitude of the second bias voltage input to the selected bit line.

A time period required for the word line WL connected to the selected memory cell to have a relatively high charge capacitance may increase by delaying the turn-off timing of at least one of the first switch element LX1 and the second switch element GX1. Therefore, in accordance with a decrease in the threshold voltage of the selected memory cell due to a decrease in the operating temperature, sensing margin may be sufficiently secured. An effect such as the securing the sensing margin may be obtained by increasing the magnitude of the second bias voltage input to the selected bit line.

Alternatively, according to example embodiments, a magnitude of the off voltage input to at least one of the first switch element LX1 and the second switch element GX1 by the switch control circuit 541 may vary depending on the operation temperature. For example, when the operating temperature decreases, the magnitude of the off voltage may decrease, and when the operating temperature increases, the magnitude of the off voltage may increase.

When the operating temperature decreases, the magnitude of the off voltage may decrease, such that at least one of the first switch element LX1 and the second switch element GX1 may be surely turned off. Therefore, a time period required for the word line WL connected to the selected memory cell to have a relatively high charge capacitance may decrease, and read disturb may be prevented. When the operating temperature increases, the magnitude of the off voltage may increase, such that at least one of the first switch element LX1 and the second switch element GX1 may not be reliably turned off. Therefore, the sensing margin may be ensured by increasing a time period required for the word line WL connected to the selected memory cell to have a relatively high charge capacitance.

Figure 16:
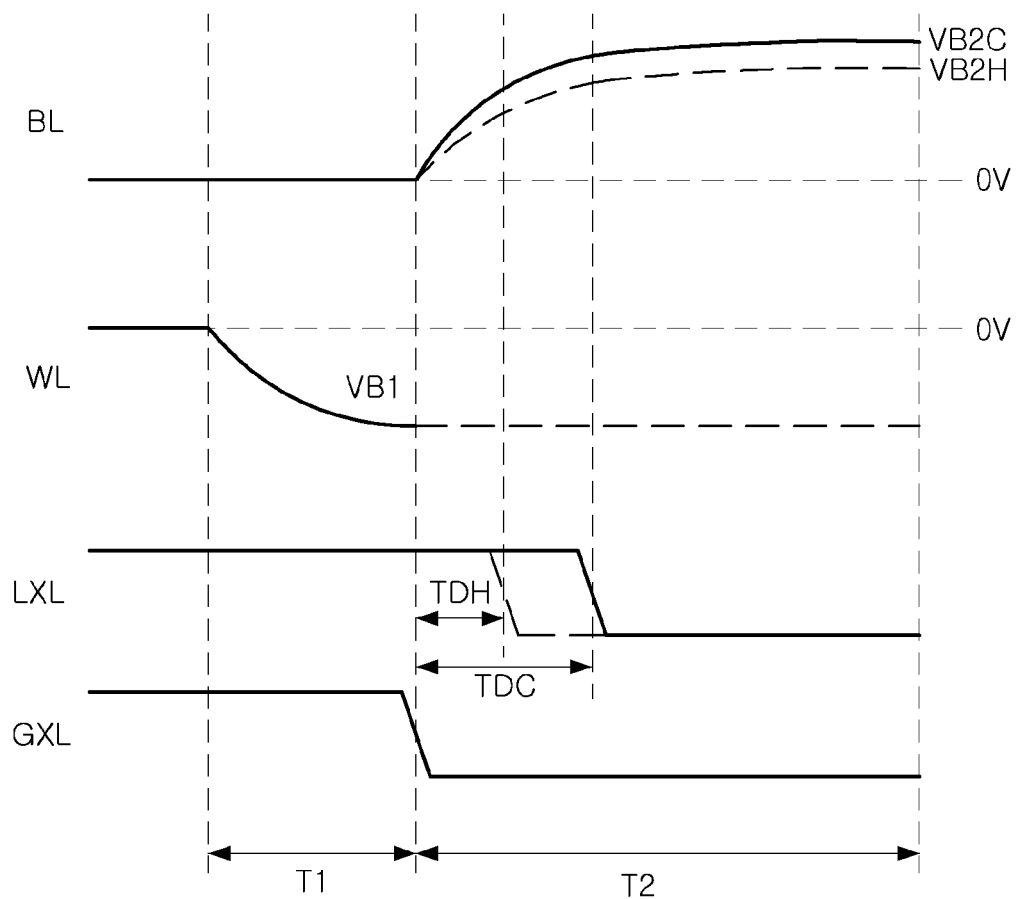
FIGS. 16 to 18 are timing diagrams illustrating a reading operation of a memory device according to an embodiment of the present inventive concept.
Figure 17:
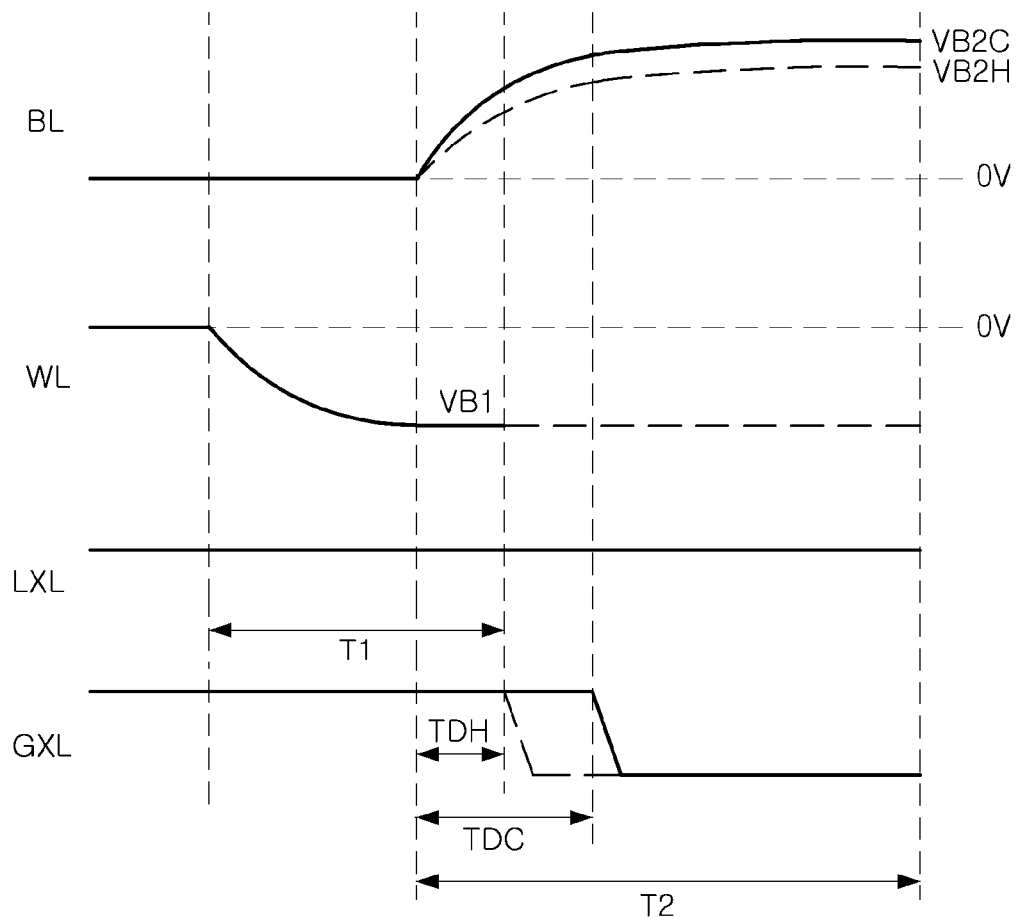
Figure 18:
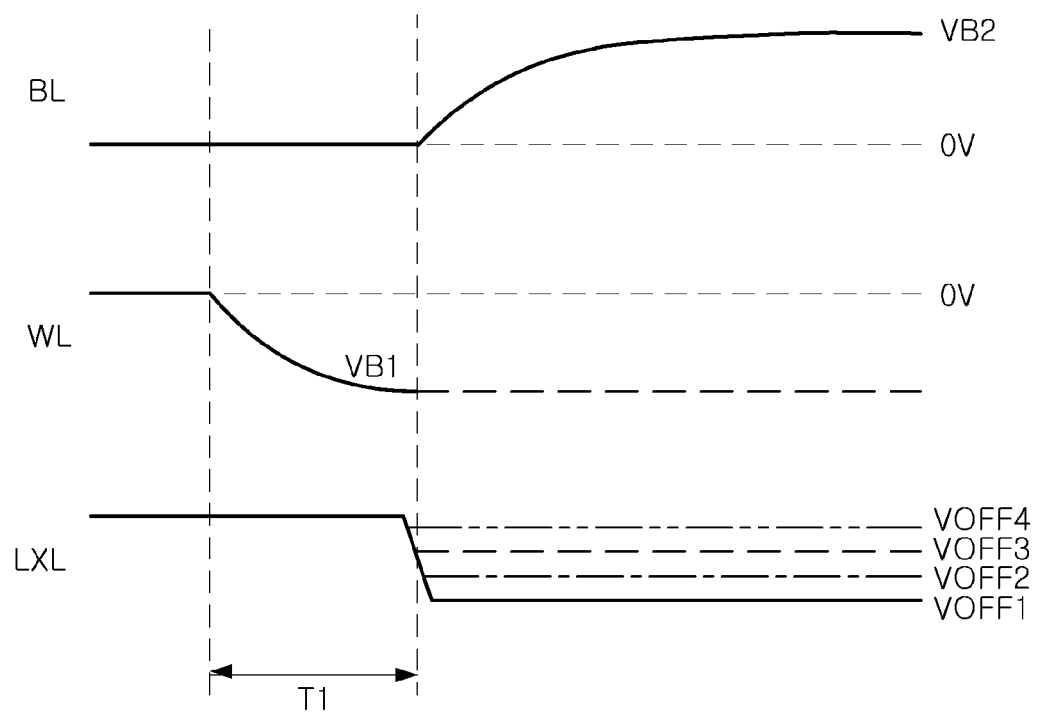

FIGS. 16 to 18 are timing diagrams illustrating a reading operation of a memory device according to an embodiment of the present inventive concept.

In embodiments illustrated in FIGS. 16 to 18, a word line WL may be pre-charged by a first bias voltage VB1, and a selected bit line BL may be pre-charged by second bias voltages VB2C and VB2H. The first bias voltage VB1 may be a negative voltage, and a second bias voltage VB2 may be a positive voltage. A selected word line WL may be pre-charged by the first bias voltage VB1 input to the selected word line WL during a first period of time T1.

When the selected word line WL is pre-charged by the first bias voltage VB1, the second bias voltages VB2C and VB2H may be input to the selected bit line BL. For example, when a second period of time T2 starts, the second bias voltage VB2 may be input to the selected bit line BL. A magnitude of the second bias voltages VB2C and VB2H may vary, depending on an operating temperature.

Referring first to FIG. 16, when a second period of time T2 starts, a second switch element may be turned off by a second control signal GXL. A selected word line WL may be floated as the second switch element is turned off. A first switch element may be maintained in a turned-on state during a first delay time TDC or a second delay time TDH, and may be turned off after the first delay time TDC or the second delay time TDH lapses. For example, the first switch element may be turned off within a time period floating the selected word line WL. During the first delay time TDC or the second delay time TDH, a charge capacitance of the selected word line WL may vary by the first switch element maintaining the turned-on state.

For example, when the operating temperature decreases, threshold voltages of the memory cells may increase. Therefore, a second bias voltage VB2 may input to a selected bit line BL as VB2C having a relatively high voltage to turn on a selected memory cell. Also, turn-off timing of a first control signal LXL may be delayed as the first delay time TDC having a relatively long delay time.

The memory cells may be effectively turned on and data of the selected memory cell may be read correctly in response to the threshold voltage increase with temperature decrease, by increasing a magnitude of the second bias voltage VB2C and delaying the turn-off timing of the first control signal LXL. As the magnitude of the second bias voltage VB2C increases and the turn-off timing of the first control signal LXL is delayed, the possibility of read disturb in the selected memory cell may increase. In an embodiment of the present inventive concept, a magnitude of an off voltage of the first control signal LXL may be adjusted to prevent read disturb due to the bias condition change corresponding to the temperature decrease. This will be described later with reference to FIG. 18.

As the operating temperature increases, the threshold voltage decreases and the memory cells may be relatively easily turned on, such that a second bias voltage may be VB2H having a relatively low voltage and turn-off timing of the first control signal LXL may be delayed as the second delay time TDH having a relatively short delay time. Therefore, a magnitude of electric current flowing through the selected memory cell may decrease, or a time period used for which the selected memory cell is turned on may be reduced, such that sensing margin of the selected memory cell may be reduced, and read fail may occur. The magnitude of the off voltage of the first control signal LXL may be adjusted to prevent the read fail due to bias condition change corresponding to the temperature increase.

In an embodiment, a voltage magnitude of the first control signal LXL during the first delay time TDC or the second delay time TDH may vary in consideration of the operating temperature. For example, a voltage magnitude of the first control signal LXL during the first delay time TDC selected when the operating temperature decreases may be smaller than a voltage magnitude of the first control signal LXL during the second delay time TDH selected when the operating temperature increases.

Referring to FIG. 17, a first switch element may be maintained in a turned-on state by a first control signal LXL, and a second switch element may be turned off at predetermined timing by a second control signal GXL. In the embodiment illustrated in FIG. 17, a first period of time T1 and a second period of time T2 may partially overlap each other. According to example embodiments, when the second switch element is turned off and a selected word line WL is floated, the first switch element may be turned off. For example, the first switch element may be turned off with the second switch element simultaneously, or may be turned off later than the second switch element.

For example, when the operating temperature decreases, a magnitude of a second bias voltage may be the VB2C, or turn-off timing of the second control signal GXL may be delayed as the first delay time TDC. Therefore, a selected memory cell may be effectively turned on. The read disturb due to the increase of the second bias voltage VB2C and the turn-off timing change of the second control signal GXL may be prevented by adjusting the off voltage of the second control signal GXL.

When the operating temperature increases, a threshold voltage of the memory cells may decrease and the memory cells may be easily turned on, such that a second bias voltage may be the VB2H or turn-off timing of the second control signal GXL may be delayed as the second delay time TDH. Therefore, the possibility of read fail occurring may increase, as compared with a case in which the operating temperature decreases. In an embodiment of the present inventive concept, the read fail may be prevented by adjusting the off voltage of the second control signal GXL.

Referring to FIG. 17, a voltage magnitude of the second control signal GXL during the first delay time TDC may be different from a voltage magnitude of the second control signal GXL during the second delay time TDH. For example, a voltage magnitude of the second control signal GXL during the first delay time TDC, which may be selected when the operating temperature decreases, may be smaller than a voltage magnitude of the second control signal GXL during the second delay time TDH, which may be selected when the operating temperature increases.

Referring to FIG. 18, a magnitude of an off voltage of a first control signal LXL input to a first switch element may vary, depending on an operating temperature. For example, the first control signal LXL may be input to the first switch element in a one magnitude of first to fourth off voltages VOFF1 to VOFF4. In this case, in some examples, the second control signal GXL may be input to the second switch element in one magnitude of first to fourth off voltages VOFF1 to VOFF4. In some examples, the second switch element is turned on when the first control signal LXL is input to the first switch element in one magnitude of first to fourth off voltages VOFF1 to VOFF4.

As the operating temperature decreases, a threshold voltage may increase not to easily turn on a selected memory cell. In order to solve this problem, a voltage level of a second bias voltage VB2 may increase, and possibility of the read disturb due to an increase the voltage level of the second bias voltage VB2 may increase. Therefore, the off voltage of the first control signal LXL may decrease to reduce a charge capacitance of a selected word line WL. When the operating temperature increases, the selected memory cell may be easily turned on, such that a voltage level of the second bias voltage VB2 may decrease. Sensing margin may decrease with the low voltage level of the second bias voltage VB2, and possibility of the read fail may increase. In an embodiment of the present inventive concept, sensing margin may be ensured by increasing the off voltage of the first control signal LXL to increase a charge capacitance of the selected word line WL. For example, when the operating temperature decreases, the off voltage of the first control signal LXL may have a value close to the first off voltage VOFF1. When the operating temperature increases, the off voltage of the first control signal LXL may have a value close to the fourth off voltage VOFF4.

Figure 19:
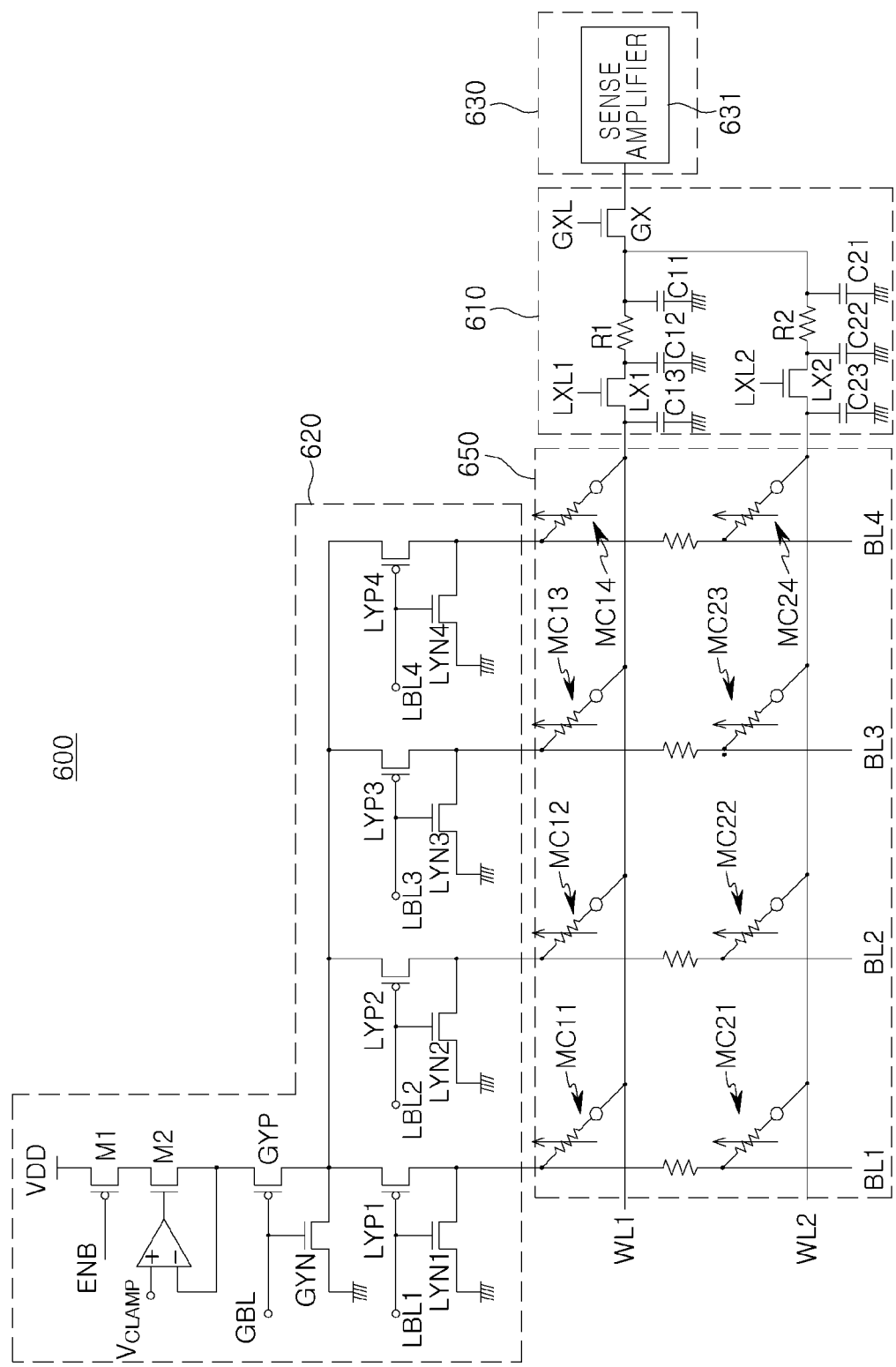
FIG. 19 is a circuit diagram illustrating an operation of a memory device according to an embodiment of the present inventive concept.
Figure 20:
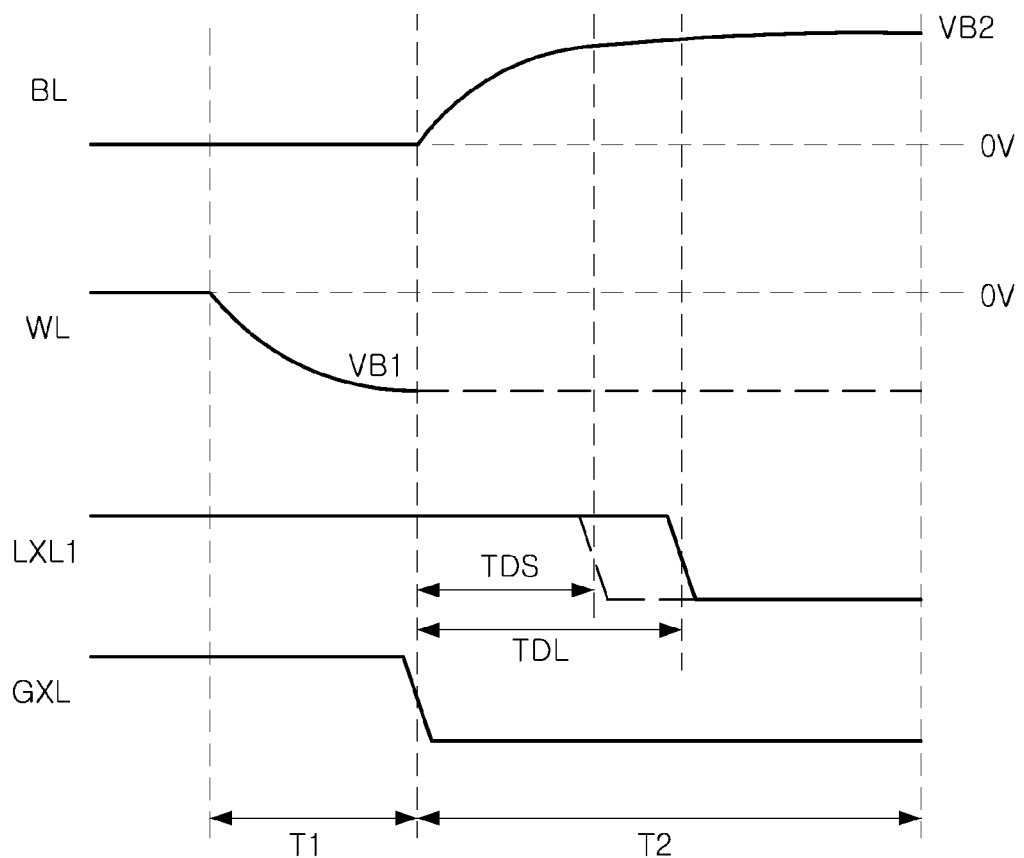
FIG. 20 is a timing diagram illustrating a reading operation of a memory device according to an embodiment of the present inventive concept.

FIG. 19 is a circuit diagram illustrating an operation of a memory device according to an embodiment of the present inventive concept. FIG. 20 is a timing diagram illustrating a reading operation of a memory device according to an embodiment of the present inventive concept.

Referring to FIG. 19, a memory device 600 according to an embodiment of the present inventive concept may include a first decoder circuit 610, a second decoder circuit 620, a read-out circuit 630, a memory cell array 650, and the like. Although only two word lines WL1 and WL2 and four bit lines BL1 to BL4 are illustrated in the embodiment illustrated in FIG. 19, the number thereof may be variously changed. The memory cell array 650 may include memory cells MC11 to MC14, and MC21 to MC24 connected to the word lines WL1 and WL2, and the bit lines BL1 to BL4. Configuration and operation of the first decoder circuit 610, the second decoder circuit 620, the read-out circuit 630, and the memory cell array 650 may be similar to those described above with reference to FIG. 7.

In an embodiment illustrated in FIG. 19, the memory device 600 may set a reading operation differently, depending on a position of a selected memory cell. For example, when the selected memory cell is one of the first memory cells MC11 to MC14 connected to the first word line WL1, a resistance of the selected bit line connected to the selected memory cell may be decreased so that a sensing margin of the selected memory cell may be increased. Therefore, when one of the first memory cells MC11 to MC14 is the selected memory cell, turn-off timing of a first switch element LX1 or a second switch element GX, connected to the first word line WL1, may be reduced. For example, the turn-off timing of the first switch element LX1 may be reduced by shortening a delay time as TDS, as illustrated in FIG. 20.

When the selected memory cell is one of second memory cells MC21 to MC24 connected to a second word line WL2, turn-off timing of a first switch element LX2 or the second switch element GX, connected to the second word line WL2, may be delayed, in consideration of sensing margin reduction of the selected memory cell. Referring to FIG. 20, the turn-off timing of the first switch element LX1 may be delayed by increasing a delay time as TDL. In this case, the second memory cells MC21 to MC24 and the second word line WL2 may be located far away from the first memory cells MC11 to MC14 and the first word line WL1.

Figure 21:
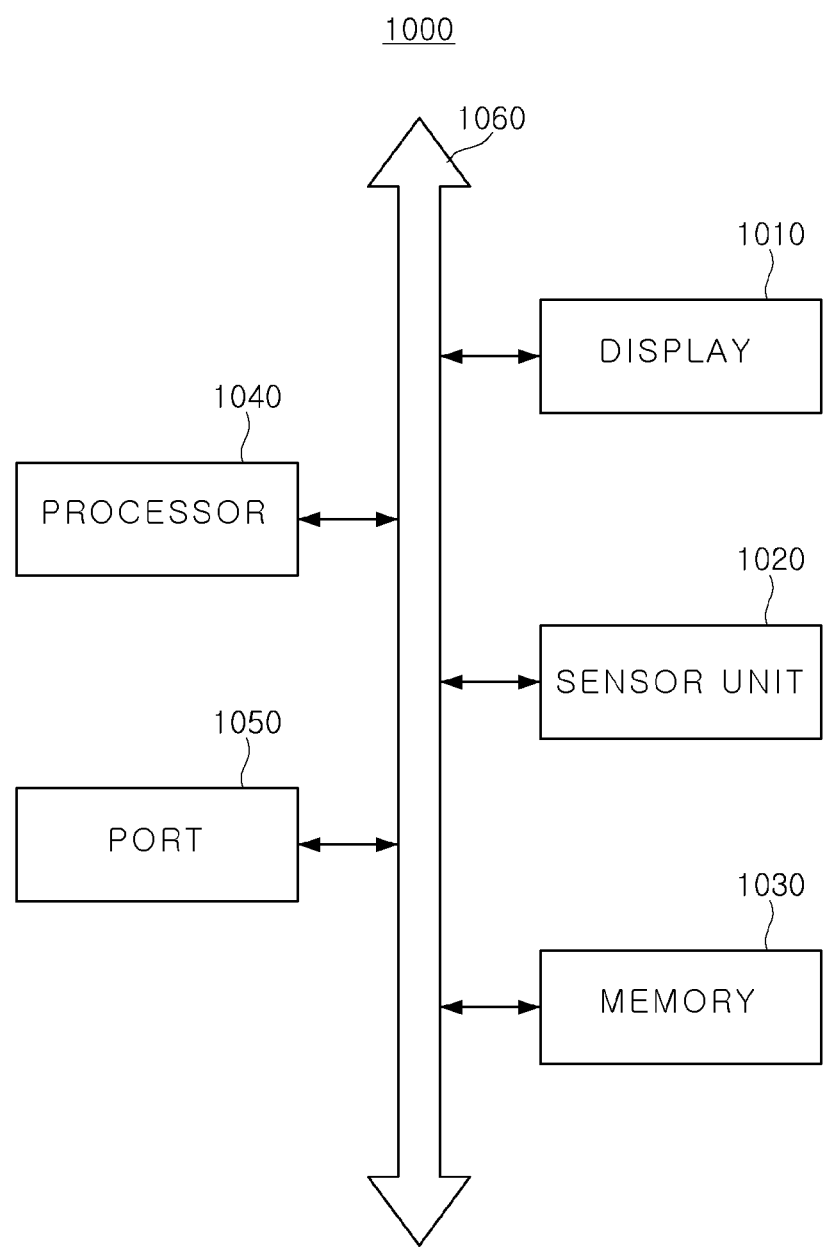
FIG. 21 is a block diagram schematically illustrating an electronic device including a memory device according to an embodiment of the present inventive concept.

FIG. 21 is a block diagram schematically illustrating an electronic device including a memory device according to an embodiment of the present inventive concept.

A computer device 1000 according to an embodiment illustrated in FIG. 21 may include a display 1010, a sensor unit 1020, a memory 1030, a processor 1040, a port 1050, and the like. In addition, the computer device 1000 may further include a wired/wireless communications unit, a power supply unit, and the like. Among the components illustrated in FIG. 21, the port 1050 may be a device in which the computer device 1000 is provided for communicating with a video card, a sound card, a memory card, a universal serial bus (USB) device, and the like. The computer device 1000 may be a concept including both a general desktop computer or laptop computer, as well as a smartphone, a tablet personal computer (PC), a smart wearable device, and the like.

The processor 1040 may perform specific operations, commands, tasks, and the like. The processor 1040 may be a central processing unit (CPU) or a microprocessor unit (MCU), a system on chip (SoC), etc., and may be connected to the display 1010, the sensor unit 1020, the memory device 1030, as well as to other units connected the port 1050, through a bus 1060.

The memory 1030 may be storage medium for storing data, or multimedia data for operating the computer device 1000. The memory 1030 may include a volatile memory, such as a random access memory (RAM), or a non-volatile memory, such as a flash memory. The memory 1030 may also include at least one of a solid state drive (SSD), a hard disk drive (HDD), and an optical disc drive (ODD) as a storage unit. The computer device 1000 may include an input/output unit, for example, an input device may include a keyboard, a mouse, a touch screen and the like, and an output device may include a display, an audio output, etc.

The memory 1030 may include a phase change memory device that writes/erases and reads data using the resistance change of the phase change material. In an embodiment illustrated in FIG. 21, the memory 1030 may include a memory device according to various embodiments described above with reference to FIGS. 1 to 20.

According to an embodiment of the present inventive concept, a bias voltage may be sequentially input to a selected word line and a selected bit line connected to a selected memory cell to which data is to be read. After a bit line voltage is input to the selected bit line and a predetermined delay time elapses, an optimized reading operation according to a magnitude of a threshold voltage of the selected memory cell may be realized by turning off a switch element between the selected word line and a bias circuit. Therefore, read disturb and read fail may be minimized, and performance of the memory device may be improved.

The various and advantageous advantages and effects of the present inventive concept may be not limited to the above description, and may be more easily understood in the course of describing a specific embodiment of the present inventive concept.

While the present inventive concept has been shown and described with reference to example embodiments thereof, it will be apparent to those skilled in the art that modifications and variations could be made thereto without departing from the scope of the present inventive concept as defined by the appended claims.

What is claimed is:

1. A memory device comprising:
    a plurality of memory cells connected to a plurality of word lines and a plurality of bit lines, each of the plurality of memory cells including a selection element and an information storage element, the information storage element connected to the selection element and having a phase change material;
    a decoder circuit including:
    a first bias circuit configured to supply a first bias voltage to a selected word line of the plurality of word lines,
    a second bias circuit configured to supply a second bias voltage to a selected bit line of the plurality of bit lines,
    a first switch element connected to the selected word line, and
    a second switch element connected between the first switch element and the first bias circuit; and
    a control logic configured to control the first and second switch elements,
    wherein the memory device is configured such that, when a predetermined delay time elapses after the second bias voltage is supplied to the selected bit line, the control logic turns off the first and second switch elements, turns off the first switch element while the second switch element is turned on, or turns off the second switch element while the first switch element is turned on.

2. The memory device according to claim 1, wherein the first switch element and the second switch element are connected to each other in series between the selected word line and the first bias circuit, and
    wherein the first switch element is connected between the selected word line and the second switch element.

3. The memory device according to claim 2, wherein the second switch element is connected to two or more word lines among the plurality of word lines.

4. The memory device according to claim 2, wherein the memory device is configured such that, before the second bias voltage is supplied to the selected bit line, the control logic turns on the first switch element and the second switch element to supply the first bias voltage to the selected word line.

5. The memory device according to claim 4, wherein the memory device is configured such that, when the second bias voltage is supplied to the selected bit line, the control logic maintains the first and second switch elements in a turned-on state, and when the delay time elapses, the control logic turns off the first switch element.

6. The memory device according to claim 1, wherein the memory device is configured such that the control logic determines the delay time, based on an operating temperature of the memory device.

7. The memory device according to claim 6, wherein the memory device is configured such that:
    the control logic decreases the delay time, when the operating temperature increases, and
    the control logic increases the delay time, when the operating temperature decreases.

8. The memory device according to claim 1, wherein the memory device is configured such that the control logic determines the delay time, based on a position of the selected memory cell.

9. The memory device according to claim 8, wherein the memory device is configured such that:
    the control logic determines the delay time to be a first delay time, when a distance between the selected word line and the second bias circuit has a first distance, and
    the control logic determines the delay time to be a second delay time longer than the first delay time, when a distance between the selected word line and the second bias circuit has a second distance longer than the first distance.

10. The memory device according to claim 1, wherein the second bias voltage has a constant positive voltage when the predetermined delay time elapses.

11. A memory device comprising:
    a memory cell connected to a word line and a bit line;
    a first decoder circuit including a first bias circuit configured to supply a first bias voltage to the word line during a first period of time;
    a second decoder circuit including a second bias circuit configured to supply a second bias voltage to the bit line during a second period of time after the first period of time; and
    a control logic configured to electrically separate the first bias circuit from the word line, when a predetermined delay time elapses from a start time of the second period of time,
    wherein the second bias voltage has a constant positive voltage.

12. The memory device according to claim 11, wherein the second period of time overlaps at least a portion of the first period of time.

13. The memory device according to claim 12, wherein the word line receives the first bias voltage during the overlapping time.

14. The memory device according to claim 11, wherein the delay time is included in the second period of time.

15. The memory device according to claim 11, wherein the first decoder circuit further includes:
    a first switch element connected to the word line; and
    a second switch element connected between the first switch element and the first bias circuit,
    wherein the first decoder circuit is configured such that the first bias circuit electrically separates the first bias circuit from the word line by supplying an off voltage to the first switch element based on an operating temperature of the memory device.

16. The memory device according to claim 15, wherein the off voltage has a first magnitude, when the operating temperature is a first temperature, and wherein the off voltage has a second magnitude greater than the first magnitude, when the operating temperature is a second temperature higher than the first temperature.

17. A method for operating a memory device comprising:
supplying a first bias voltage output from a first bias circuit to a selected word line connected to a selected memory cell to read data;
turning on a first switch element connected to the selected word line;
turning on a second switch element connected between the first switch element and the first bias circuit;
supplying a second bias voltage to a selected bit line connected to the selected memory cell; and
turning off at least one of the first switch element and the second switch element, when a predetermined delay time elapses after the second bias voltage is input.

18. The method according to claim 17, wherein the turning off of the first switch element or the second switch element includes:

supplying an off voltage to the first switch element or the second switch element, and based on an operating temperature of the memory device, determining at least one of the delay time, a magnitude of the off voltage and a magnitude of the second bias voltage.

19. The method according to claim 18, wherein the magnitude of the off voltage is a first magnitude, when the operating temperature is a first temperature, and wherein the magnitude of the off voltage is a second magnitude smaller than the first magnitude, when the operating temperature is a second temperature lower than the first temperature.

20. The method according to claim 17, wherein the second bias voltage has a constant positive voltage when the predetermined delay time elapses.

* * * * *